United States Patent
Caron

(10) Patent No.: US 11,038,487 B2
(45) Date of Patent: Jun. 15, 2021

(54) FBAR FILTER WITH INTEGRATED CANCELATION CIRCUIT

(71) Applicant: SKYWORKS SOLUTIONS, INC., Irvine, CA (US)

(72) Inventor: Joshua James Caron, Madison, NC (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

(21) Appl. No.: 16/515,302

(22) Filed: Jul. 18, 2019

(65) Prior Publication Data

US 2020/0028487 A1 Jan. 23, 2020

Related U.S. Application Data

(60) Provisional application No. 62/699,950, filed on Jul. 18, 2018.

(51) Int. Cl.
*H03H 9/54* (2006.01)
*H03H 9/02* (2006.01)
(Continued)

(52) U.S. Cl.
CPC .......... *H03H 9/54* (2013.01); *H03H 9/02228* (2013.01); *H03H 9/171* (2013.01); *H03H 9/205* (2013.01); *H03H 9/706* (2013.01)

(58) Field of Classification Search
CPC ...... H03H 9/02228; H03H 9/17; H03H 9/171; H03H 9/205; H03H 9/54; H03H 9/64–76
See application file for complete search history.

(56) References Cited

U.S. PATENT DOCUMENTS 4,516,094 A * 5/1985 Lee ..................... H03H 9/0285
310/313 D
4,799,029 A 1/1989 Minomo
(Continued)

FOREIGN PATENT DOCUMENTS

| JP | S62261211 A | 11/1987 |
| JP | H08316773 A | 11/1996 |

(Continued)

OTHER PUBLICATIONS

Lin et al., "Two-Port Filters and Resonators on ALN/3C-SIC Plates Utilizing High-Order Lamb Wave Modes", 2013 IEEE 26th International Conference on Micro Electro Mechanical Systems (MEMS), Taipei, 2013, pp. 789-792.
(Continued)

*Primary Examiner* — Dean O Takaoka
*Assistant Examiner* — Alan Wong
(74) *Attorney, Agent, or Firm* — Lando & Anastasi, LLP

(57) ABSTRACT

An acoustic wave device includes an acoustic wave filter configured to filter a radio frequency signal and a loop circuit coupled to the acoustic wave filter. The loop circuit is configured to generate an anti-phase signal to a target signal at a particular frequency. The loop circuit includes a Lamb wave resonator having a piezoelectric layer and an interdigital transducer electrode disposed on the piezoelectric layer. The piezoelectric layer includes free edges. An edge of the piezoelectric layer is configured to one of suppress or scatter reflections of acoustic waves generated by the interdigital transducer electrode from the edge of the piezoelectric layer.

20 Claims, 21 Drawing Sheets

(51) Int. Cl.
  *H03H 9/70* (2006.01)
  *H03H 9/205* (2006.01)
  *H03H 9/17* (2006.01)

(56) References Cited

U.S. PATENT DOCUMENTS

| | | | |
|---|---|---|---|
| 4,906,885 A | 3/1990 | Kojima et al. | |
| 5,666,091 A | 9/1997 | Hikita et al. | |
| 5,682,126 A | 10/1997 | Plesski et al. | |
| 5,864,262 A | 1/1999 | Ikada | |
| 5,905,418 A | 5/1999 | Ehara et al. | |
| 5,994,980 A | 11/1999 | Tada | |
| 6,049,260 A | 4/2000 | Yoshimoto et al. | |
| 6,262,637 B1 | 7/2001 | Bradley et al. | |
| 6,404,302 B1 | 6/2002 | Satoh et al. | |
| 6,462,633 B1 | 10/2002 | Ichikawa | |
| 6,677,835 B2 | 1/2004 | Noguchi et al. | |
| 6,707,352 B2 | 3/2004 | Kawaguchi | |
| 6,791,238 B2 * | 9/2004 | Kuratani | H03H 9/02629 310/313 D |
| 7,084,718 B2 | 8/2006 | Nakamura et al. | |
| 7,733,196 B2 | 6/2010 | Tsurunari et al. | |
| 7,941,103 B2 | 5/2011 | Iwamoto et al. | |
| 8,174,339 B2 | 5/2012 | Matsuda et al. | |
| 8,228,137 B2 | 7/2012 | Inoue et al. | |
| 8,378,760 B2 | 2/2013 | Iwaki et al. | |
| 8,618,992 B2 | 12/2013 | Fujiwara et al. | |
| 8,970,320 B2 * | 3/2015 | Iwaki | H03H 9/725 333/132 |
| 9,118,303 B2 * | 8/2015 | Inoue | H03H 9/0576 |
| 9,219,467 B2 | 12/2015 | Inoue et al. | |
| 9,246,533 B2 | 1/2016 | Fujiwara et al. | |
| 9,520,857 B2 * | 12/2016 | Fujiwara | H03H 9/6483 |
| 10,404,234 B2 | 9/2019 | Bi et al. | |
| 10,476,482 B2 | 11/2019 | Niwa et al. | |
| 10,615,772 B2 * | 4/2020 | Yen | H03H 9/02047 |
| 10,727,812 B2 * | 7/2020 | Araki | H03H 9/706 |
| 2004/0130411 A1 | 7/2004 | Beaudin et al. | |
| 2004/0246077 A1 | 12/2004 | Misu et al. | |
| 2007/0024392 A1 | 2/2007 | Inoue et al. | |
| 2007/0090895 A1 | 4/2007 | Nishizawa et al. | |
| 2008/0238572 A1 | 10/2008 | Funami et al. | |
| 2010/0026419 A1 | 2/2010 | Hara et al. | |
| 2010/0102901 A1 | 4/2010 | Tsuda | |
| 2010/0109802 A1 | 5/2010 | Tanaka | |
| 2010/0150075 A1 | 6/2010 | Inoue et al. | |
| 2010/0194494 A1 | 8/2010 | Inoue et al. | |
| 2011/0199169 A1 | 8/2011 | Kadota | |
| 2011/0254639 A1 | 10/2011 | Tsutsumi et al. | |
| 2012/0119847 A1 | 5/2012 | Iwaki et al. | |
| 2013/0113576 A1 | 5/2013 | Inoue et al. | |
| 2013/0147578 A1 | 6/2013 | Hara et al. | |
| 2013/0214873 A1 | 8/2013 | Takamine | |
| 2014/0113571 A1 | 4/2014 | Fujiwara et al. | |
| 2015/0171827 A1 | 6/2015 | Kawasaki | |
| 2016/0105158 A1 | 4/2016 | Fujiwara et al. | |
| 2017/0093373 A1 | 3/2017 | Fujiwara et al. | |
| 2017/0099043 A1 | 4/2017 | Goto et al. | |
| 2017/0331456 A1 | 11/2017 | Ono | |

FOREIGN PATENT DOCUMENTS

| | | |
|---|---|---|
| JP | H09312587 A | 12/1997 |
| JP | 2002158599 A | 5/2002 |
| JP | 2004242280 A | 8/2004 |
| JP | 2006311041 A | 11/2006 |
| JP | 2007124085 A | 5/2007 |
| JP | 2010041141 A | 2/2010 |
| JP | 2010154437 A | 7/2010 |
| JP | 2011160203 A | 8/2011 |
| JP | 2012109818 A | 6/2012 |
| JP | 2013-048491 A | 3/2013 |
| JP | 2013118611 A | 6/2013 |
| WO | 0070758 A1 | 11/2000 |
| WO | 0201715 A1 | 1/2002 |
| WO | 2009025106 A1 | 2/2009 |
| WO | 2010073377 A1 | 7/2010 |

OTHER PUBLICATIONS

Yantchev et al., "Thin AlN Film Resonators utilizing the Lowest order Symmetric Lamb mode: Further Developments", Proceedings of the IEEE International Frequency Control Symposium and Exposition (2007), pp. 1067-1072.

Yen et al., "Fine Frequency Selection Techniques for Aluminum Nitride Lamb Wave Resonators", 2010 IEEE International Frequency Control Symposium, Newport Beach, CA, 2010, pp. 9-13.

Yen et al., "Synthesis of Narrowband AlN Lamb Wave Ladder-Type Filters Based on Overhang Adjustment", 2010 IEEE International Ultrasonics Symposium, San Diego, CA, 2010, pp. 970-973.

Zou, "High Quality Factor Lamb Wave Resonators", Technical Report No. UCB/EECS-2015-1, <http://www.eecs.berkeley.edu/Pubs/TechRpts/2015/EECS-2015-1.html>, Electrical Engineering and Computer Sciences University of California at Berkeley (2015).

* cited by examiner

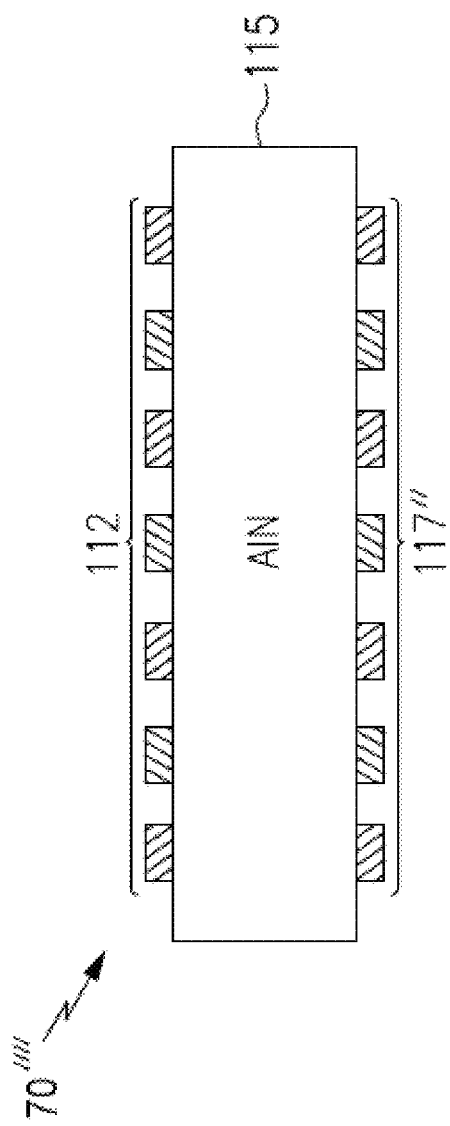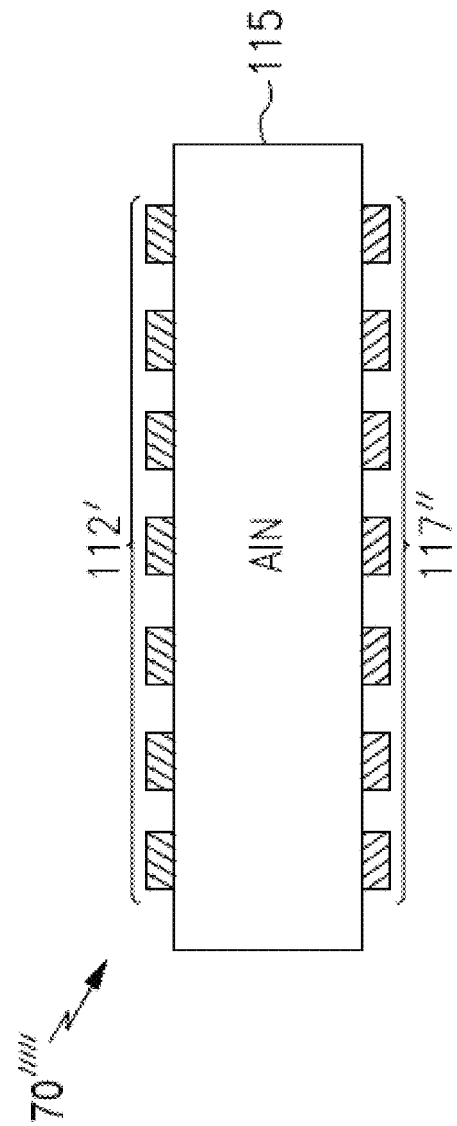

FBAR FILTER WITH INTEGRATED CANCELATION CIRCUIT

CROSS-REFERENCE TO RELATED APPLICATIONS

This application claims priority under 35 U.S.C. § 119(e) to U.S. Provisional Patent Application Ser. No. 62/699,950, titled FBAR FILTER WITH INTEGRATED CANCELLATION CIRCUIT, filed Jul. 18, 2018 which is incorporated herein by reference in its entirety for all purposes.

BACKGROUND

Technical Field

Embodiments of this disclosure relate to acoustic wave filters.

Description of Related Technology

Acoustic wave filters can filter radio frequency signals. An acoustic wave filter can include a plurality of resonators arranged to filter a radio frequency signal. The resonators can be arranged as a ladder circuit. Example acoustic wave filters include surface acoustic wave (SAW) filters, bulk acoustic wave (BAW) filters, and Lamb wave resonator filters. A film bulk acoustic resonator (FBAR) filter is an example of a BAW filter. A solidly mounted resonator (SMR) filter is another example of a BAW filter.

Acoustic wave filters can be implemented in radio frequency electronic systems. For instance, filters in a radio frequency front end of a mobile phone can include acoustic wave filters. Two acoustic wave filters can be arranged as a duplexer.

SUMMARY

In accordance with an aspect disclosed herein, there is provided an acoustic wave device. The acoustic wave device comprises an acoustic wave filter configured to filter a radio frequency signal and a loop circuit coupled to the acoustic wave filter, the loop circuit configured to generate an anti-phase signal to a target signal at a particular frequency, the loop circuit including a Lamb wave resonator having a piezoelectric layer and an interdigital transducer electrode disposed on the piezoelectric layer, the piezoelectric layer including free edges, an edge of the piezoelectric layer configured to one of suppress or scatter reflections of acoustic waves generated by the interdigital transducer electrode from the edge of the piezoelectric layer.

In some embodiments, the piezoelectric layer is an aluminum nitride layer.

In some embodiments, the piezoelectric layer is a lithium niobate layer.

In some embodiments, the piezoelectric layer is a lithium tantalate layer.

In some embodiments, an acoustic wave mode utilized in the Lamb wave resonator is one of the lowest-order asymmetric (A0) mode, the lowest-order symmetric (S0) mode, the lowest-order shear horizontal (SH0) mode, first-order asymmetric (A1) mode, the first-order symmetric (S1) mode, or the first-order shear horizontal (SH1) mode.

In some embodiments, the Lamb wave resonator is a solidly mounted resonator. The Lamb wave resonator may include Bragg reflectors.

In some embodiments, the Lamb wave resonator is a free-standing resonator.

In some embodiments, the acoustic wave filter includes a bulk acoustic wave resonator. The piezoelectric layer of the Lamb wave resonator may be formed of a same material as a piezoelectric material of the bulk acoustic wave resonator. The bulk acoustic wave resonator may be a film bulk acoustic resonator. The bulk acoustic wave resonator may be a solidly mounted resonator.

In some embodiments, the acoustic wave filter includes a second Lamb wave resonator.

In some embodiments, the Lamb wave resonator and at least one resonator of the acoustic wave filter are disposed on a same semiconductor substrate.

In some embodiments, the acoustic wave filter is a transmit filter.

In some embodiments, the acoustic wave filter is a receive filter.

In some embodiments, the acoustic wave device further comprises a second acoustic wave filter, the acoustic wave filter and the second acoustic wave filter being included in a duplexer.

In accordance with an aspect disclosed herein, there is provided an acoustic wave device. The acoustic wave device comprises an acoustic wave filter configured to filter a radio frequency signal, the acoustic wave filter including a bulk acoustic wave resonator, and a loop circuit coupled to the acoustic wave filter, the loop circuit configured to generate an anti-phase signal to a target signal at a particular frequency, the loop circuit including a Lamb wave resonator having a piezoelectric layer, the piezoelectric layer including free edges, an edge of the piezoelectric layer configured to one of suppress or scatter reflections of acoustic waves from the edge of the piezoelectric layer.

In some embodiments, the bulk acoustic wave resonator is a film bulk acoustic resonator. The film bulk acoustic resonator and the Lamb wave resonator may include respective piezoelectric layers formed of a same material. The respective piezoelectric layers may include or consist of aluminum nitride. The film bulk acoustic resonator and the Lamb wave resonator may be disposed over a same silicon substrate.

In some embodiments, the bulk acoustic wave resonator is a solidly mounted resonator. The solidly mounted resonator and the Lamb wave resonator may be disposed over a same silicon substrate.

In some embodiments, the acoustic wave filter is a transmit filter.

In some embodiments, the acoustic wave filter is a receive filter.

In some embodiments, the acoustic wave device comprises a second acoustic wave filter, the acoustic wave filter and the second acoustic wave filter being included in a duplexer.

In accordance with another aspect, there is provided a radio frequency module. The radio frequency module comprises a duplexer including an acoustic wave device, the acoustic wave device including an acoustic wave filter configured to filter a radio frequency signal and a loop circuit coupled to the acoustic wave filter, the loop circuit configured to generate an anti-phase signal to a target signal at a particular frequency, and the loop circuit including a Lamb wave resonator having a piezoelectric layer and an interdigital transducer electrode disposed on the piezoelectric layer, the piezoelectric layer including free edges, an edge of the piezoelectric layer configured to one of suppress or scatter reflections of acoustic waves generated by the interdigital transducer electrode from the edge of the piezoelectric layer, and a radio frequency switch arranged to pass a radio frequency signal associated with a port of the duplexer.

In some embodiments, the radio frequency module further comprises a power amplifier, the radio frequency switch coupled in a signal path between the power amplifier and the duplexer.

In some embodiments, the radio frequency switch is an antenna switch.

In some embodiments, the radio frequency switch is a band select switch.

In accordance with another aspect, there is provided a wireless communication device. The wireless communication device comprises a radio frequency front end including an acoustic wave device, the acoustic wave device including an acoustic wave filter configured to filter a radio frequency signal and a loop circuit coupled to the acoustic wave filter, the loop circuit configured to generate an anti-phase signal to a target signal at a particular frequency, and the loop circuit including a Lamb wave resonator having a piezoelectric layer and an interdigital transducer electrode disposed on the piezoelectric layer, the piezoelectric layer including free edges, an edge of the piezoelectric layer configured to one of suppress or scatter reflections of acoustic waves generated by the interdigital transducer electrode from the edge of the piezoelectric layer, and an antenna in communication with the radio frequency front end.

In accordance with another aspect, there is provided a filter. The filter comprises an input terminal, an output terminal, a main bulk acoustic wave filter circuit connected between the input terminal and the output terminal, the main bulk acoustic wave filter circuit having a first phase characteristic, a first passband, and a first stopband, and a phase shift circuit connected in parallel with the main bulk acoustic wave filter circuit between the input terminal and the output terminal, the phase shift circuit including a first capacitor element, a second capacitor element, and a Lamb mode coupled resonator connected in series between the first capacitor element and the second capacitor element, the Lamb mode coupled resonator including at least two interdigitated transducer electrodes disposed apart from each other on a piezoelectric layer in a single acoustic wave path along which acoustic waves propagate through the Lamb mode coupled resonator, the piezoelectric layer including free edges, an edge of the piezoelectric layer configured to one of suppress or scatter reflections of acoustic waves generated by the Lamb mode coupled resonator from the edge of the piezoelectric layer, the phase shift circuit having a second phase characteristic that is opposite to the first phase characteristic in an attenuation band that corresponds to at least a portion of the first stopband.

In accordance with another aspect, there is provided a filter. The filter comprises an input terminal, an output terminal, a main film bulk acoustic resonator filter circuit connected between the input terminal and the output terminal, the main film bulk acoustic resonator filter circuit having a first phase characteristic, a first passband, and a first stopband, and a phase shift circuit connected in parallel with the main film bulk acoustic resonator filter circuit between the input terminal and the output terminal, the phase shift circuit including a first capacitor element, a second capacitor element, and a Lamb mode coupled resonator connected in series between the first capacitor element and the second capacitor element, the Lamb mode coupled resonator including a at least two interdigitated transducer electrodes disposed apart from each other on a piezoelectric layer in a single acoustic wave path along which acoustic waves propagate through the Lamb mode coupled resonator, the piezoelectric layer including free edges, an edge of the piezoelectric layer configured to one of suppress or scatter reflections of acoustic waves generated by the Lamb mode coupled resonator from the edge of the piezoelectric layer, the phase shift circuit having a second phase characteristic that is opposite to the first phase characteristic in an attenuation band that corresponds to at least a portion of the first stopband.

BRIEF DESCRIPTION OF THE DRAWINGS

Embodiments of this disclosure will now be described, by way of non-limiting example, with reference to the accompanying drawings.

FIG. 7E illustrates a cross-section of another Lamb wave acoustic wave element that includes free edges;

FIG. 7F illustrates a cross-section of another Lamb wave acoustic wave element that includes free edges;

DETAILED DESCRIPTION OF CERTAIN EMBODIMENTS

Figure 1:
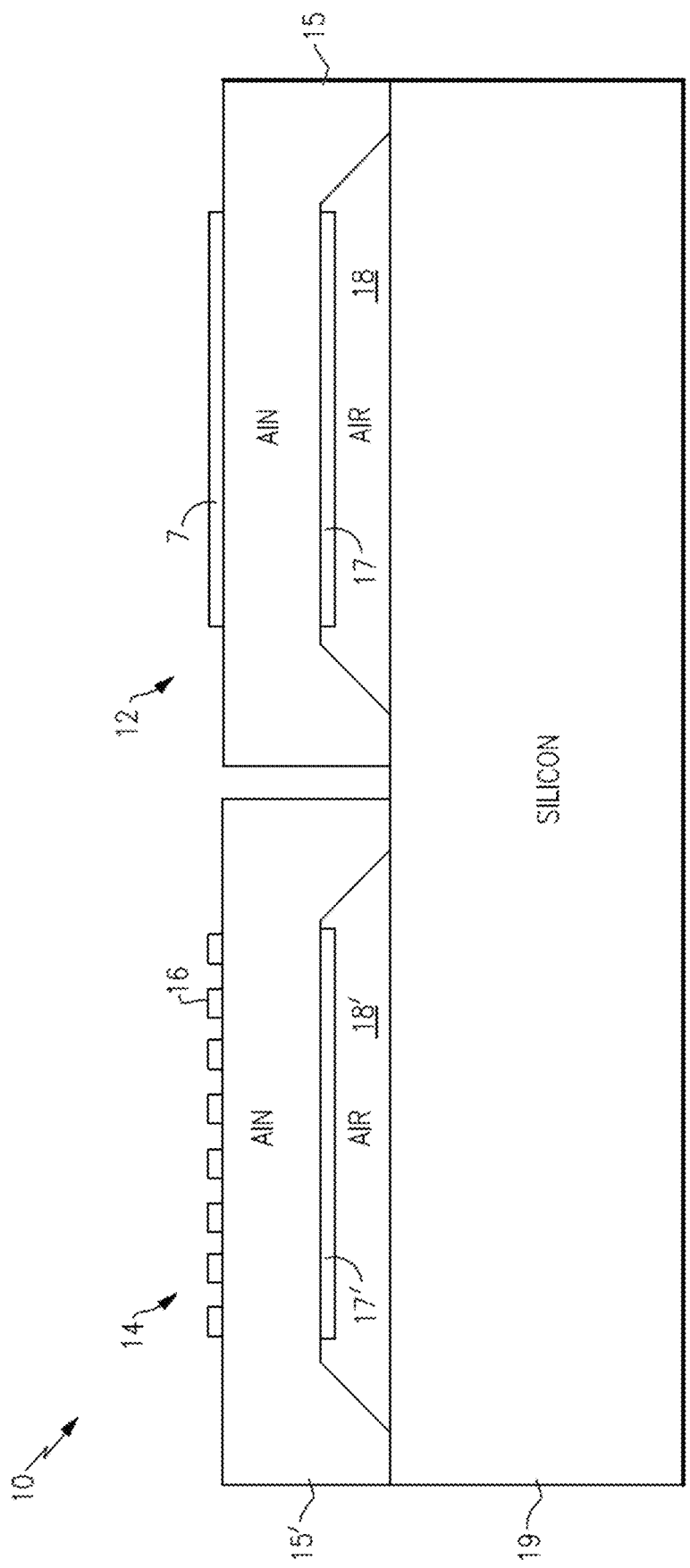
FIG. 1 is a diagram of cross-section of an acoustic wave device that includes a Lamb wave acoustic wave element of a loop circuit and a film bulk acoustic resonator (FBAR) of an acoustic wave filter according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

An acoustic wave filter can include a loop circuit to cancel an unwanted frequency component. The loop circuit can enhance transmit/receive isolation and attenuation for a particular frequency range. The loop circuit can apply a signal having approximately the same amplitude and an opposite phase to a signal component to be canceled. Surface acoustic wave (SAW) loops circuits have been used to improve isolation and attenuation characteristics in SAW filters. Some loop circuits for film bulk acoustic resonator (FBAR) filters and other bulk acoustic wave (BAW) filters have included LC circuits. Such LC circuits can include capacitor(s) and/or inductor(s) having a relatively large physical footprint and/or can be implemented external to a chip that includes the BAW filter coupled to the loop circuit.

Lamb wave loop circuits are disclosed. Lamb wave loop circuits can be integrated with BAW filters and/or duplexers. For instance, aluminum nitride (AlN) Lamb wave loop circuits can be integrated with AlN FBAR filters. Such Lamb wave loop circuits can improve transmit/receive (Tx/Rx) isolation and attenuation characteristics at any desired frequency range. A Lamb wave loop circuit can generate an anti-phase radio frequency (RF) signal to cancel a target signal at a desired frequency. The Lamb wave loop circuits discussed herein can improve the isolation and attenuation of RF acoustic wave filters, such as BAW filters (e.g., FBAR filters or SMR filters), SAW filters, and Lamb wave filters.

A Lamb wave resonator can combine features of a SAW resonator and a BAW resonator. A Lamb wave resonator typically includes an interdigital transducer (IDT) electrode similar to a SAW resonator. Accordingly, the frequency of the Lamb wave resonator can be lithographically defined. A Lamb wave resonator can achieve a relatively high quality factor (Q) and a relatively high phase velocity like a BAW filter (e.g., due to a suspended structure). A Lamb wave resonator that includes an AlN piezoelectric layer can be relatively easy to integrate with other circuits, for example, because AlN process technology can be compatible with complementary metal oxide semiconductor (CMOS) process technology. AlN Lamb wave resonators can overcome a relatively low resonance frequency limitation and integration challenge associated with SAW resonators and also overcome multiple frequency capability challenges associated with BAW resonators. Some Lamb wave resonator topologies are based on acoustic reflection from periodic reflective gratings. Some other Lamb wave resonator topologies are based on acoustic reflection from suspended free edges of a piezoelectric layer.

An AlN Lamb wave loop circuit can be directly integrated with AlN FBAR and/or other BAW filters during processing to form such filters. Such integration can also be achieved for other suitable piezoelectric films. Accordingly, a Lamb wave loop circuit can offer a cost effective and efficient way to include a loop circuit for a BAW filter. A Lamb wave loop circuit for a BAW filter can be implemented in a relatively small physical footprint. For example, a Lamb wave loop circuit can have a smaller physical footprint than an LC circuit based loop circuit. A smaller physical footprint can reduce power consumption and/or reduce manufacturing costs.

A loop circuit can include a free-standing Lamb wave resonator or a solidly mounted Lamb wave resonator. Example acoustic wave devices that include such Lamb wave resonators and resonators of an acoustic wave filter coupled to the loop circuit will be described with reference to FIGS. 1 to 6. Any suitable combination of features of these examples can be implemented together with each other.

FIG. 1 is a diagram of cross-section of an acoustic wave device 10 that includes a film bulk acoustic resonator (FBAR) 12 of an acoustic wave filter and a Lamb wave resonator 14 of a loop circuit and according to an embodiment.

The FBAR 12 includes a piezoelectric layer 15, an upper electrode 7 on an upper surface of the piezoelectric layer 15, and a lower electrode 17 on a lower surface of the piezoelectric layer 15. The piezoelectric layer 15 can be a thin film. The piezoelectric layer 15 can be an aluminum nitride layer. In other instances, the piezoelectric layer 15 can be any suitable piezoelectric layer. The piezoelectric layer 15 is disposed on a substrate 19, and defines a cavity 18 between a lower surface of the piezoelectric layer 15 and the substrate 19. The lower electrode is disposed in the cavity 18. The cavity 18 may be filled with air or another gas, or in other embodiments may be evacuated to form a vacuum cavity.

The Lamb wave resonator 14 includes features of a SAW resonator and an FBAR. As illustrated, the Lamb wave resonator 14 includes a piezoelectric layer 15', an interdigital transducer electrode (IDT) 16 on the piezoelectric layer 15', and a lower electrode 17' disposed on a lower surface of the piezoelectric layer 15'. The piezoelectric layer 15' can be a thin film. The piezoelectric layer 15' can be an aluminum nitride layer. In other instances, the piezoelectric layer 15' can be any suitable piezoelectric layer. The frequency of the Lamb wave resonator can be based on the geometry of the IDT 16. The electrode 17' can be grounded in certain instances. In some other instances, the electrode 17' can be floating. An air cavity 18' is disposed between the electrode 17' and a semiconductor substrate 19. Any suitable cavity can be implemented in place of the air cavity 18', for example, a vacuum cavity or a cavity filled with a different gas.

In the acoustic wave device 10, the piezoelectric layer 15 of the FBAR 12 may be formed of the same or similar material, for example, AlN, lithium niobate or lithium tantalate and dimensions of the piezoelectric layer 15' of the Lamb wave resonator 14, which may simplify manufacturing of the two devices in parallel. The cavities 18, 18' of the FBAR 12 and Lamb wave resonator 14 may be of similar or the same dimensions and be filled with the same or similar gas, or one or both of the cavities 18, 18' may be a vacuum cavity. The Lamb wave resonator 14 and the FBAR 12 can be disposed on the same semiconductor substrate 19. The semiconductor substrate 19 can be a silicon substrate. It is to be appreciated that due to the similarity in structure of the FBAR 12 used in the acoustic wave filter and the Lamb wave resonator 14 used in the loop circuit, the components of the loop circuit may be added to the acoustic wave filter with few, if any, additional processing steps.

Figure 2:
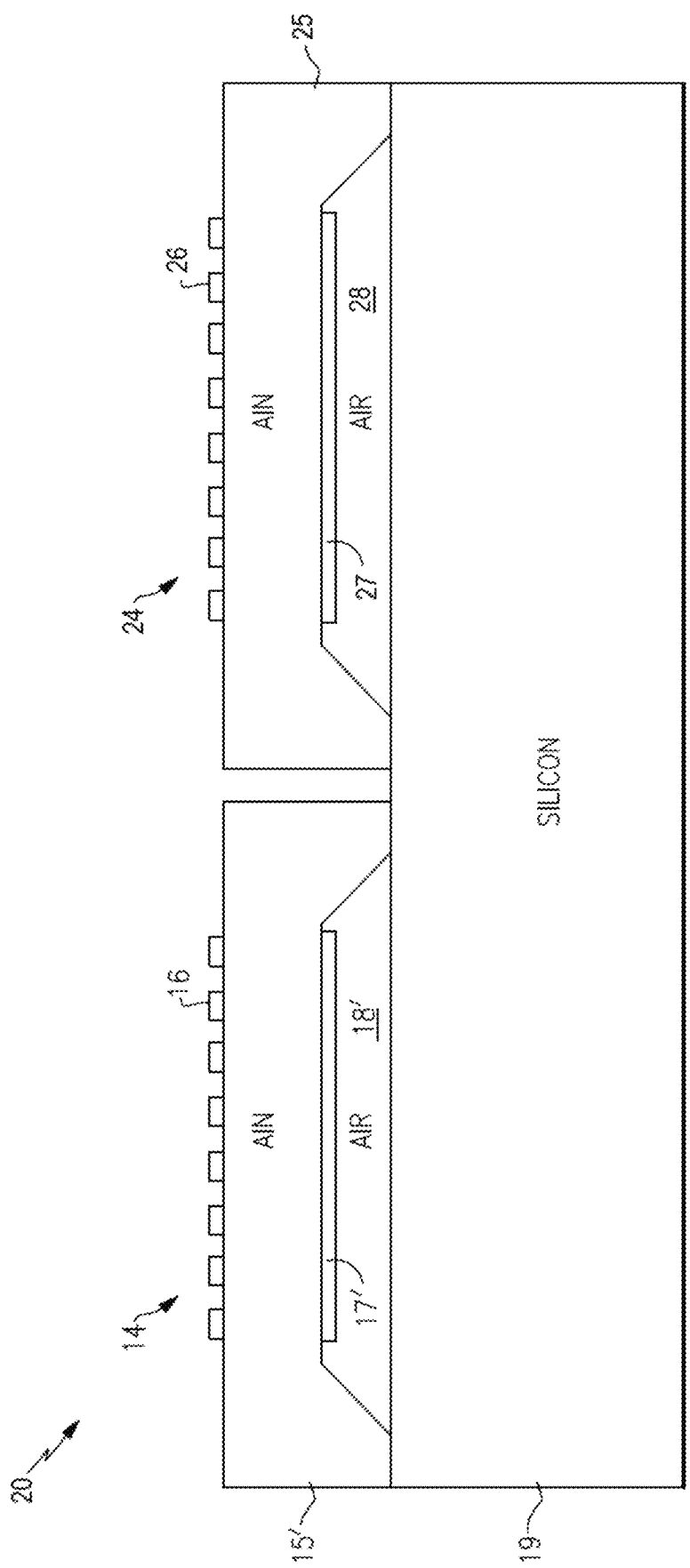
FIG. 2 is a diagram of cross-section of an acoustic wave device that includes a Lamb wave acoustic wave element of a loop circuit and a Lamb wave resonator of an acoustic wave filter according to an embodiment.

FIG. 2 is a diagram of cross-section of an acoustic wave device 20 that includes a Lamb wave resonator 14 of a loop circuit and a Lamb wave resonator 24 of an acoustic wave filter according to an embodiment. The Lamb wave resonator 24 can have the same or similar structure as the Lamb wave resonator 14, although in some embodiments the Lamb wave resonator 14 of the loop circuit and the Lamb wave resonator 24 of the acoustic wave filter have different operating frequencies. The Lamb wave resonators 14 and 24 can share a substrate 19, for example, a silicon substrate and the respective piezoelectric layers 15', 25 may be formed of the same or similar material, for example, AlN, lithium niobate, or lithium tantalate and/or of the same or similar dimensions, which may simplify manufacturing of the two devices in parallel. The respective cavities 18', 28 may be of similar or the same dimensions and be filled with the same or similar gas, or one or both of the cavities 18', 28 may be a vacuum cavity. It is to be appreciated that due to the similarity in structure of the Lamb wave resonator 24 used in the acoustic wave filter and the Lamb wave resonator 14 used in the loop circuit, the components of the loop circuit may be added to the acoustic wave filter with few, if any, additional processing steps.

Figure 3:
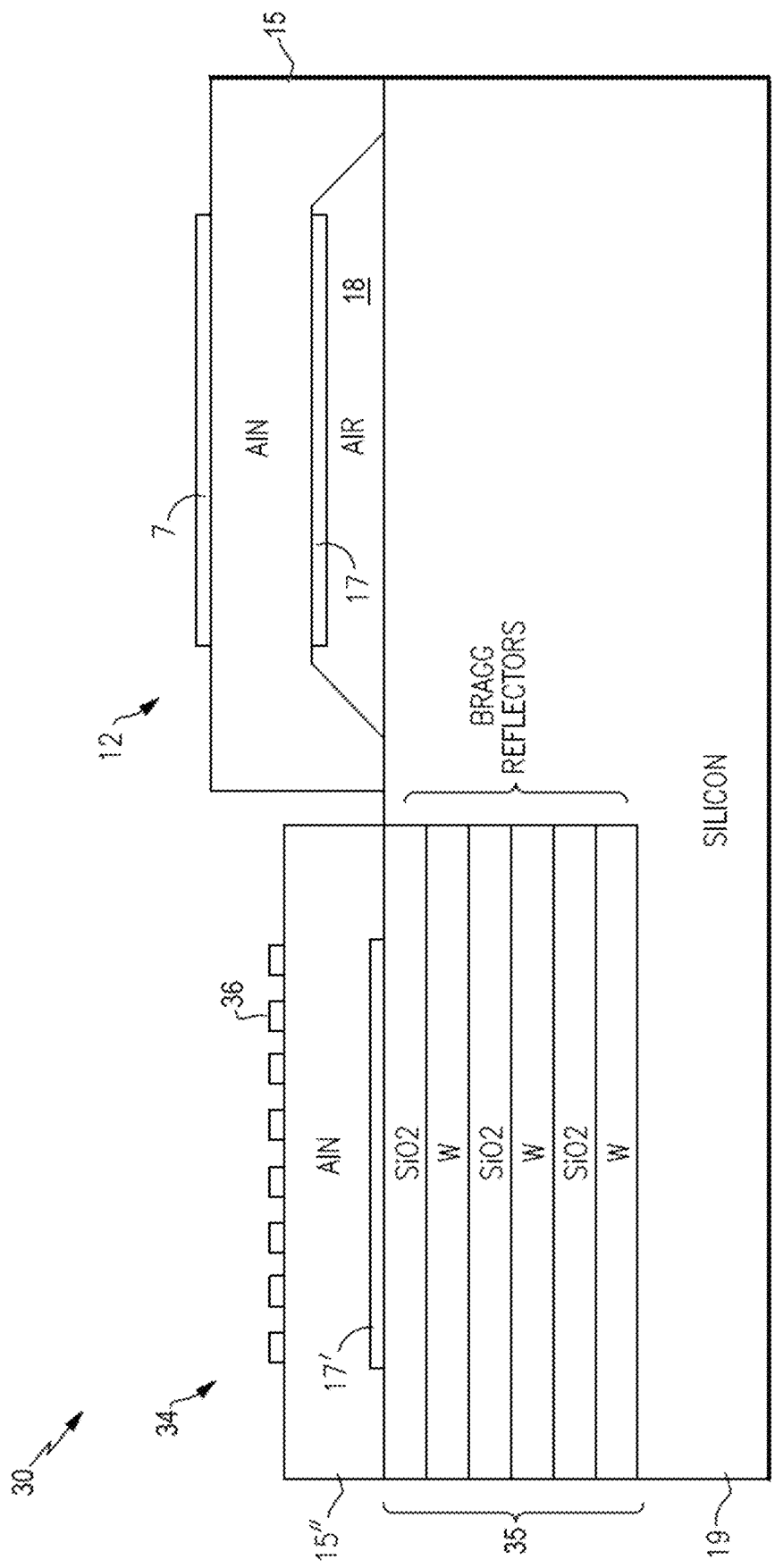
FIG. 3 is a diagram of cross-section of an acoustic wave device that includes a solidly mounted Lamb wave acoustic wave element of a loop circuit and an FBAR of an acoustic wave filter according to an embodiment.

FIG. 3 is a diagram of a cross-section of an acoustic wave device 30 that includes a solidly mounted Lamb wave resonator 34 of a loop circuit and an FBAR 12 of an acoustic wave filter according to an embodiment. The FBAR 12 of FIG. 3 may be similar or the same as the FBAR 12 of FIG. 1.

The Lamb wave resonator 34 includes feature of a SAW resonator and an SMR. As illustrated, the Lamb wave resonator 34 includes a piezoelectric layer 15", an IDT 36 on the piezoelectric layer 15", and a lower electrode 17'. The piezoelectric layer 15" can be an aluminum nitride layer. In other instances, the piezoelectric layer 15" can be any other suitable piezoelectric layer. The operating frequency of the Lamb wave resonator can be based on the geometry of the IDT 36. The electrode 17' can be grounded in certain instances. In some other instances, the electrode 17' can be floating. Bragg reflectors 35 are disposed between the electrode 17' and a semiconductor substrate 19. Any suitable Bragg reflectors can be implemented. For example, the Bragg reflectors can be $SiO_2/W$.

In the acoustic wave device 30, the Lamb wave resonator 34 and the FBAR 12 can have piezoelectric layers formed of the same or similar material, for example, AlN, lithium niobate, or lithium tantalate. The piezoelectric layer of the Lamb wave resonator 34 and the piezoelectric layer of the FBAR 12 can be disposed on the same semiconductor substrate 19. The semiconductor substrate 19 can be a silicon substrate.

Figure 4:
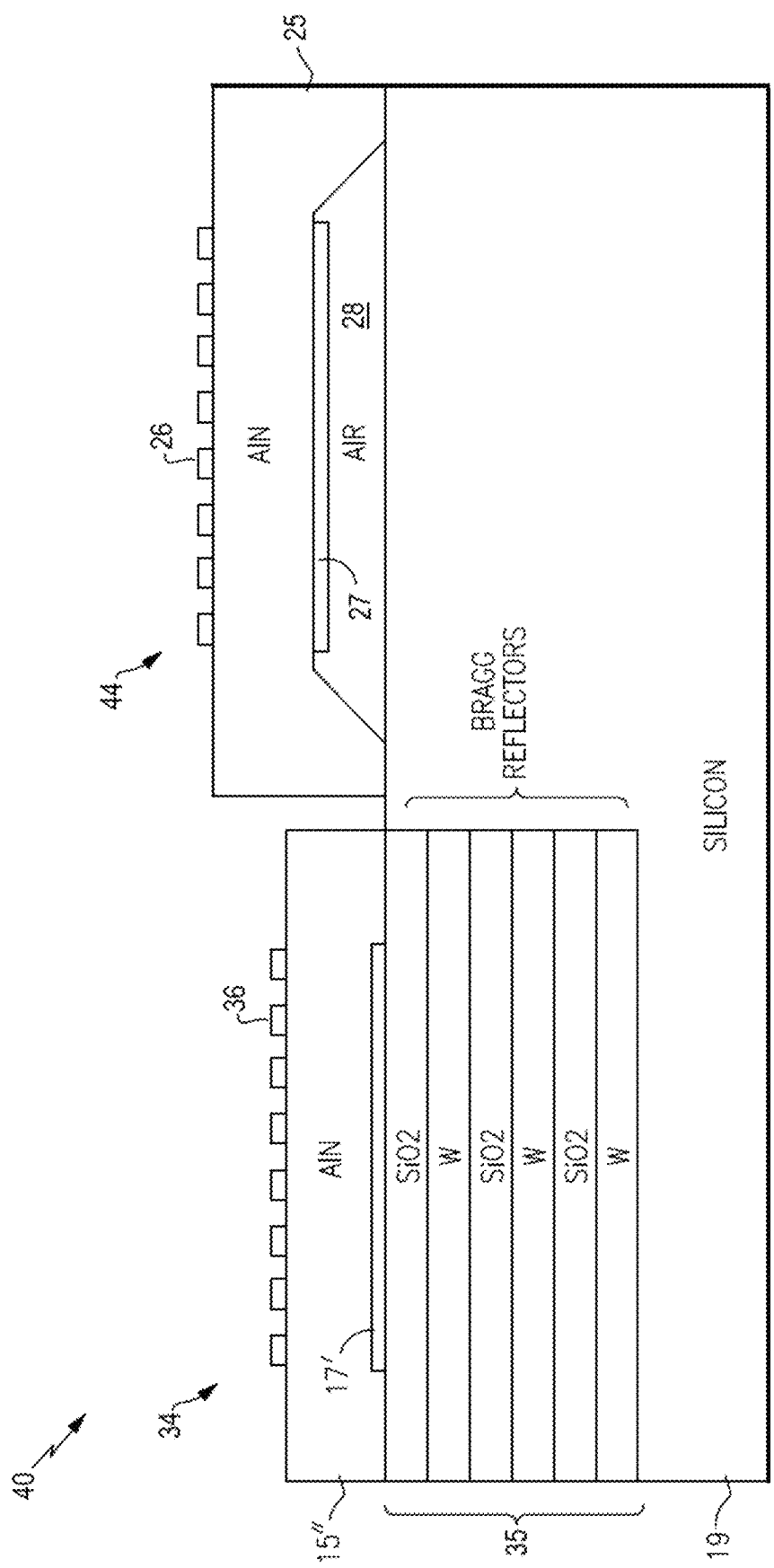
FIG. 4 is a diagram of cross-section of an acoustic wave device that includes a solidly mounted Lamb wave acoustic wave element of a loop circuit and a Lamb wave resonator of an acoustic wave filter according to an embodiment.

FIG. 4 is a diagram of a cross-section of an acoustic wave device 40 that includes a solidly mounted Lamb wave resonator 34 of a loop circuit and a Lamb wave resonator 44 of an acoustic wave filter according to an embodiment. The Lamb wave resonator 44 is a free-standing Lamb wave resonator. The solidly mounted Lamb wave resonator 34 and the Lamb wave resonator 44 can include the same piezoelectric material, for example, AlN, lithium niobate, or lithium tantalate. The solidly mounted Lamb wave resonator 34 and the Lamb wave resonator 44 can be disposed on the same semiconductor substrate 19. The solidly mounted Lamb wave resonator 34 may be substantially similar as the solidly mounted Lamb wave resonator 34 of FIG. 3. The Lamb wave resonator 44 may be substantially similar to the Lamb wave resonator 24 of FIG. 2.

Figure 5:
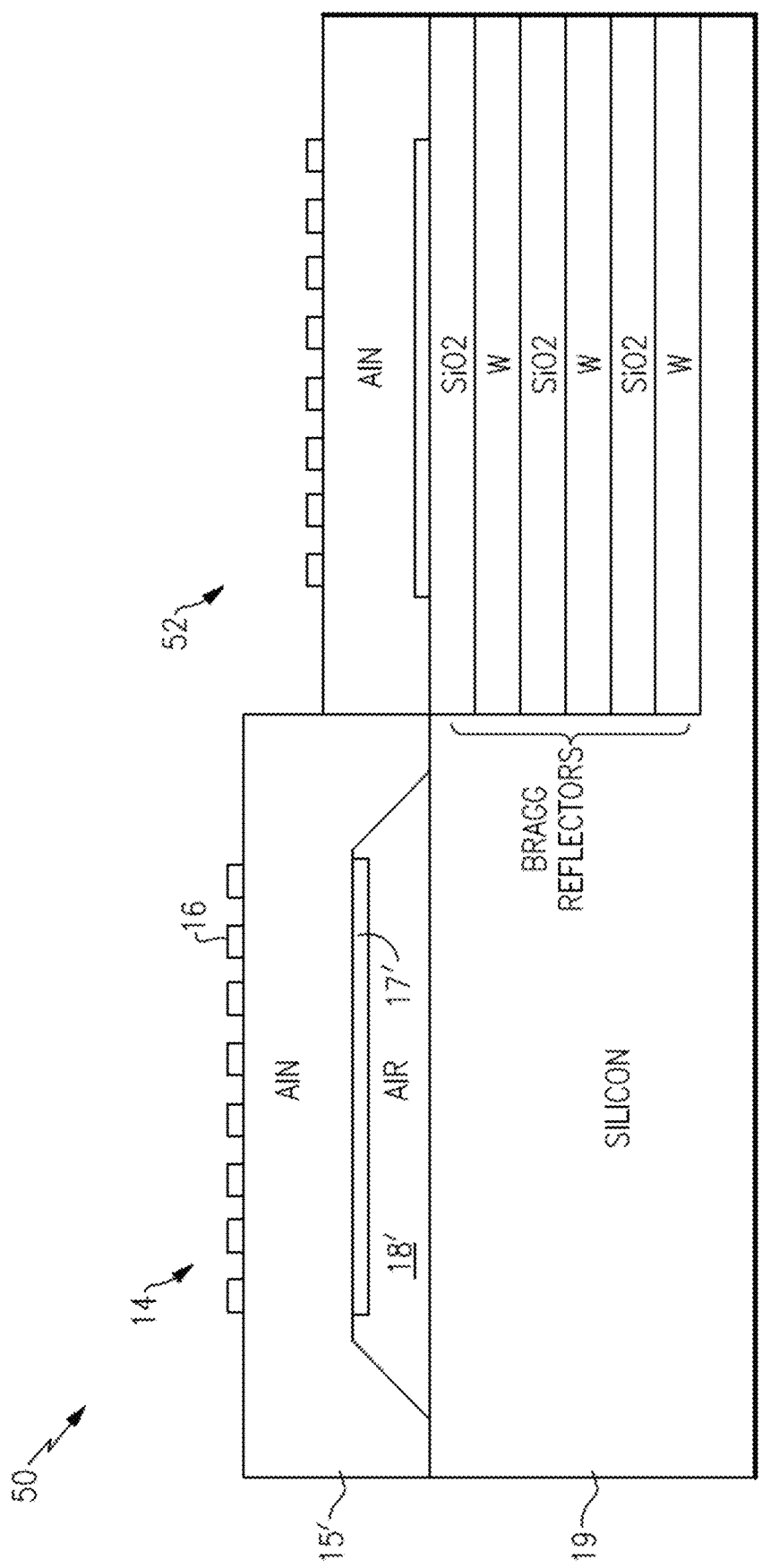
FIG. 5 is a diagram of cross-section of an acoustic wave device that includes a Lamb wave acoustic wave element of a loop circuit and a solidly mounted Lamb wave resonator of an acoustic wave filter according to an embodiment.

FIG. 5 is a diagram of a cross-section of an acoustic wave device 50 that includes a Lamb wave resonator 14 of a loop circuit and a solidly mounted Lamb wave resonator 52 of an acoustic wave filter according to an embodiment. The solidly mounted Lamb wave resonator 52 includes features of a SAW resonator and an SMR. The solidly mounted Lamb wave resonator 52 includes an IDT on a piezoelectric layer, Bragg reflectors, and an electrode between the piezoelectric layer and the Bragg reflectors. As illustrated, the solidly mounted Lamb wave resonator 52 includes a piezoelectric layer, such as an AlN layer, and $SiO_2/W$ Bragg reflectors. Any other suitable Bragg reflectors can alternatively or additionally be included in the solidly mounted Lamb wave resonator 52. The Lamb wave resonator may be substantially similar to the Lamb wave resonator 14 of FIG. 1. The solidly mounted Lamb wave resonator 52 may be substantially similar to the solidly mounted Lamb wave resonator 34 of FIG. 3.

Figure 6:
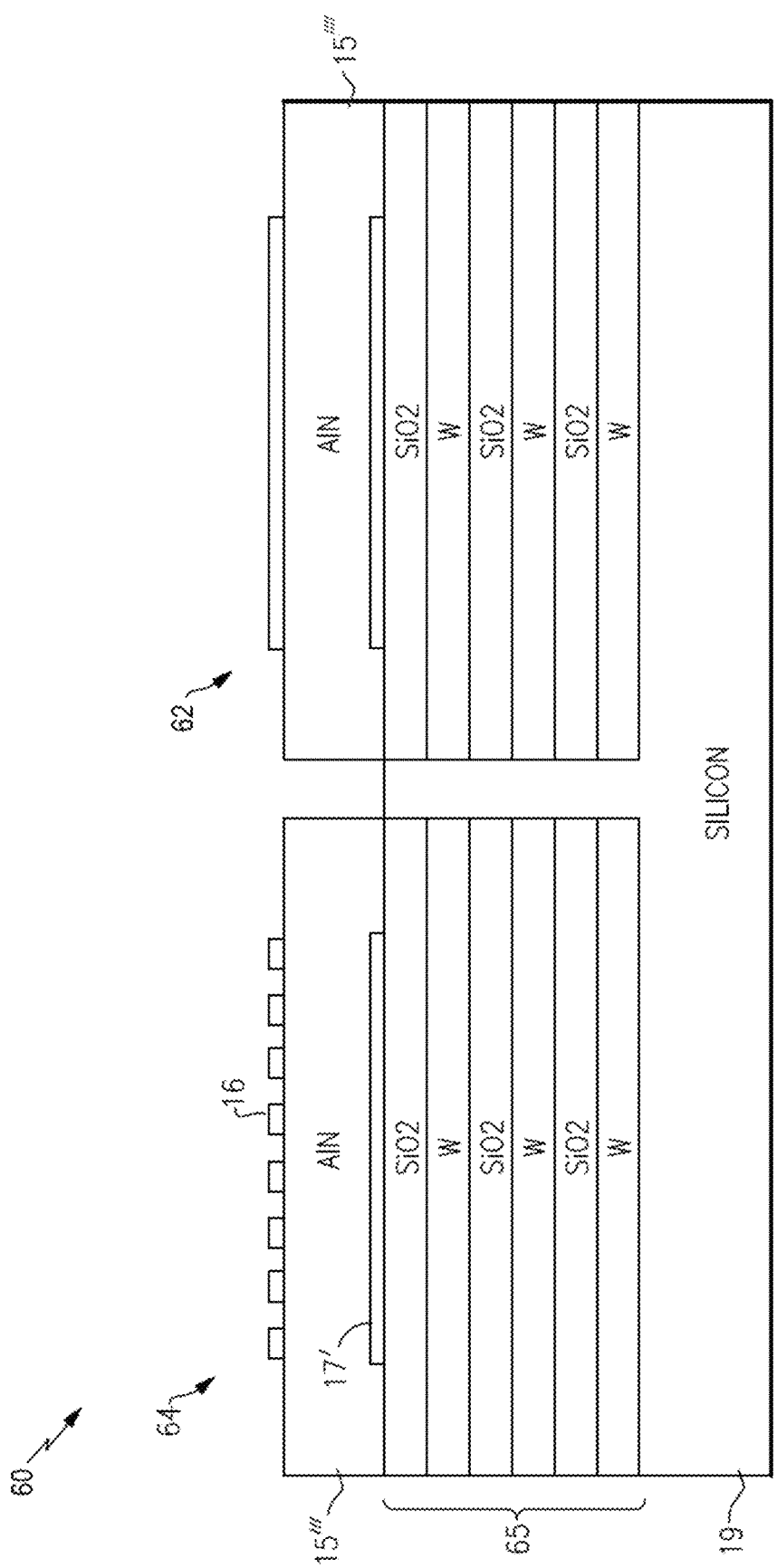
FIG. 6 is a diagram of cross-section of an acoustic wave device that includes a solidly mounted Lamb wave acoustic wave element of a loop circuit and a solidly mounted resonator (SMR) of an acoustic wave filter according to an embodiment.

FIG. 6 is a diagram of a cross-section of an acoustic wave device 60 that includes a solidly mounted Lamb wave resonator 64 of a loop circuit and an SMR 62 of an acoustic wave filter according to an embodiment. The solidly mounted Lamb wave resonator 64 is structurally similar to the SMR 62, except that the solidly mounted Lamb wave resonator 64 includes an IDT 16 disposed on piezoelectric layer 15''' and the SMR 62 includes an electrode having a different shape on the piezoelectric layer 15''''. The Bragg reflectors 65 for the solidly mounted Lamb wave resonator 64 and the SMR 62 can be separated by semiconductor material of the semiconductor substrate 19. It is to be appreciated that due to the similarity in structure of the SMR 62 used in the acoustic wave filter and the solidly mounted Lamb wave resonator 64 used in the loop circuit, the components of the loop circuit may be added to the acoustic wave filter with few, if any, additional processing steps.

Lamb wave resonators can include an IDT disposed on a piezoelectric layer having free edges. Suspended free edges of a piezoelectric layer can provide acoustic wave reflection to form a resonant cavity in such resonators. FIGS. 7A to 7F are diagrams of cross-sections of Lamb wave resonators with free edges. A Lamb wave resonator in a loop circuit can be implemented with any suitable principles and advantages of any of the Lamb wave resonators of FIGS. 7A to 7F. Although the Lamb wave resonators of FIGS. 7A to 7F are free-standing resonators, any suitable principles and advantages of these Lamb wave resonators can be applied to other Lamb wave resonators.

Figure 7A:
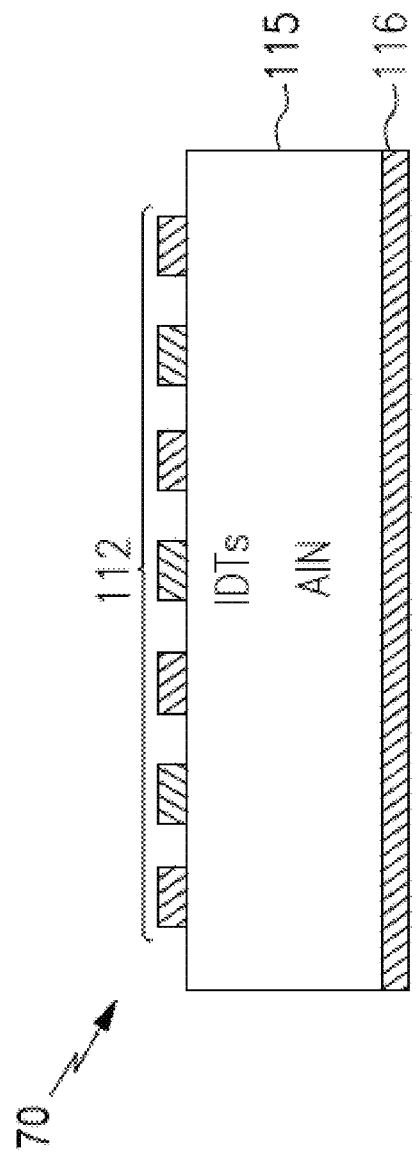
FIG. 7A illustrates a cross-section of a Lamb wave acoustic wave element with a grounded electrode and free edges.

FIG. 7A illustrates a Lamb wave resonator 70 that includes IDT 112, piezoelectric layer 115, and electrode 116. The IDT 112 is on the piezoelectric layer 115. In the illustrated cross-section, alternate ground and signal electrode fingers are included in the IDTs as illustrated by the different cross-hatching. The piezoelectric layer 115 has free edges on opposing sides of the IDT 112. The electrode 116 and the IDT 112 are on opposite sides of the piezoelectric layer 115. The piezoelectric layer 115 can be AlN, for example. The electrode 116 can be grounded.

Figure 7B:
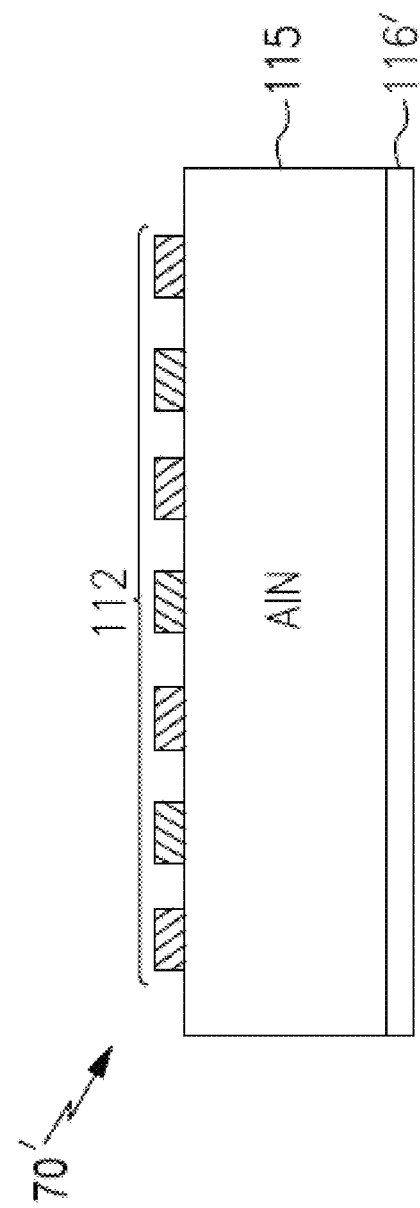
FIG. 7B illustrates a cross-section of a Lamb wave acoustic wave element with a floating electrode and free edges.

FIG. 7B illustrates a Lamb wave resonator 70'. The Lamb wave resonator 70' is like the Lamb wave resonator 70 of FIG. 7A except that the Lamb wave resonator 70' includes a floating electrode 116'.

Figure 7C:
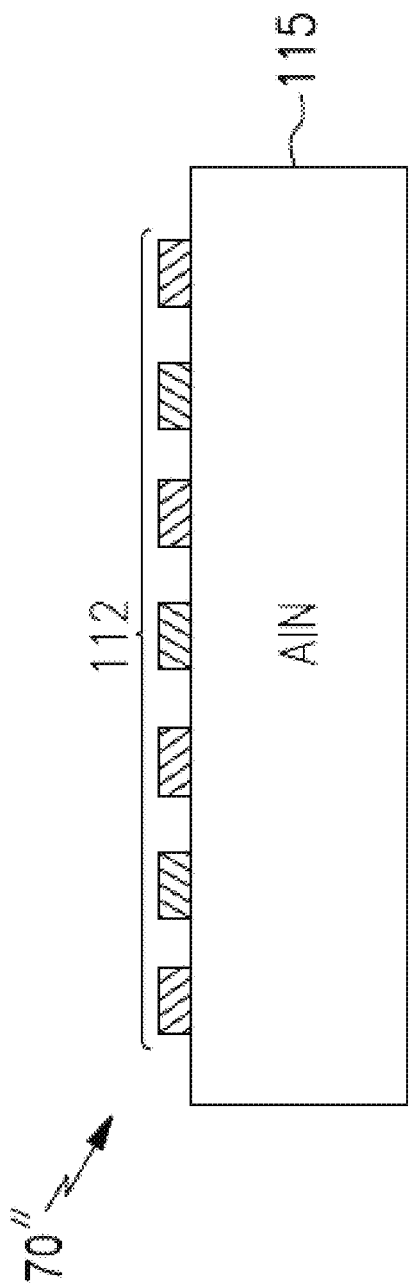
FIG. 7C illustrates a cross-section of a Lamb wave acoustic wave element without an electrode on a side of a piezoelectric layer that opposes an IDT electrode and that includes free edges.

FIG. 7C illustrates a Lamb wave resonator 70'' without an electrode on a side of the piezoelectric layer 115 that opposes the IDT 112.

Figure 7D:
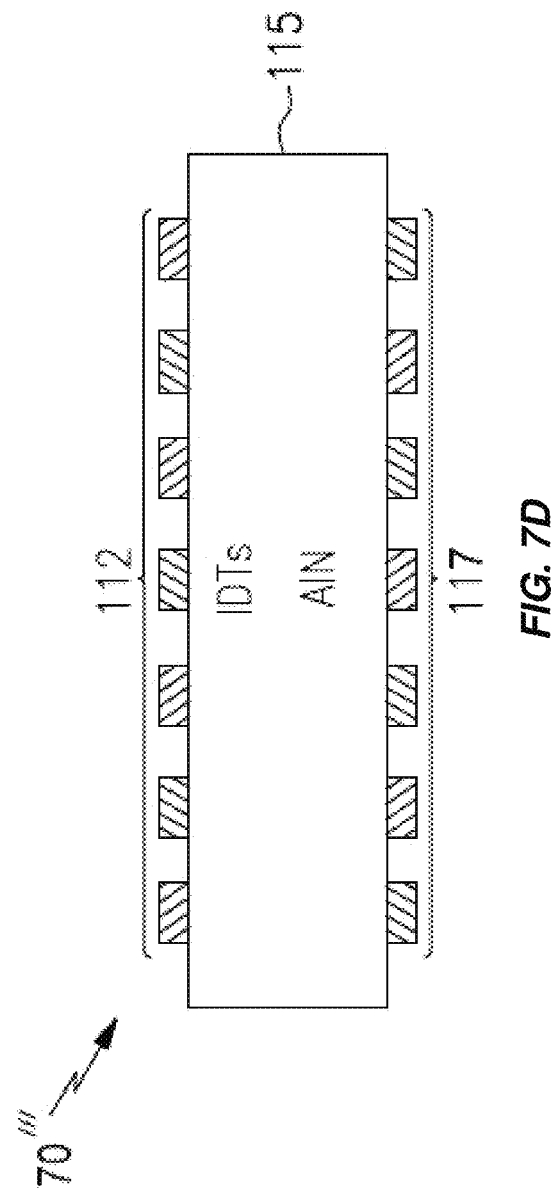
FIG. 7D illustrates a cross-section of another Lamb wave acoustic wave element that includes free edges.

FIG. 7D illustrates a Lamb wave resonator 70''' that includes an IDT 117 on a second side of the piezoelectric layer 115 that is opposite to a first side on which the IDT 112 is disposed. The signal and ground electrode fingers of the IDT electrodes are offset relative to each other for the IDTs 112 and 117 as illustrated by the different cross-hatching.

FIG. 7E illustrates a Lamb wave resonator 70'''' that includes an IDT 117' on a second side of the piezoelectric layer 115 that is opposite to a first side on which the IDT 112 is disposed. The signal and ground electrode fingers of the IDT electrodes are aligned with each other for the IDTs 112 and 117' as illustrated by the different cross-hatching.

FIG. 7F illustrates a Lamb wave resonator 70''''' that includes an IDT 117'' on a second side of the piezoelectric layer 115 that is opposite to a first side on which the IDT 112' is disposed. In the illustrated cross-section, the IDT 112' includes only signal electrodes and the IDT 117'' includes only ground electrodes.

Figure 8:
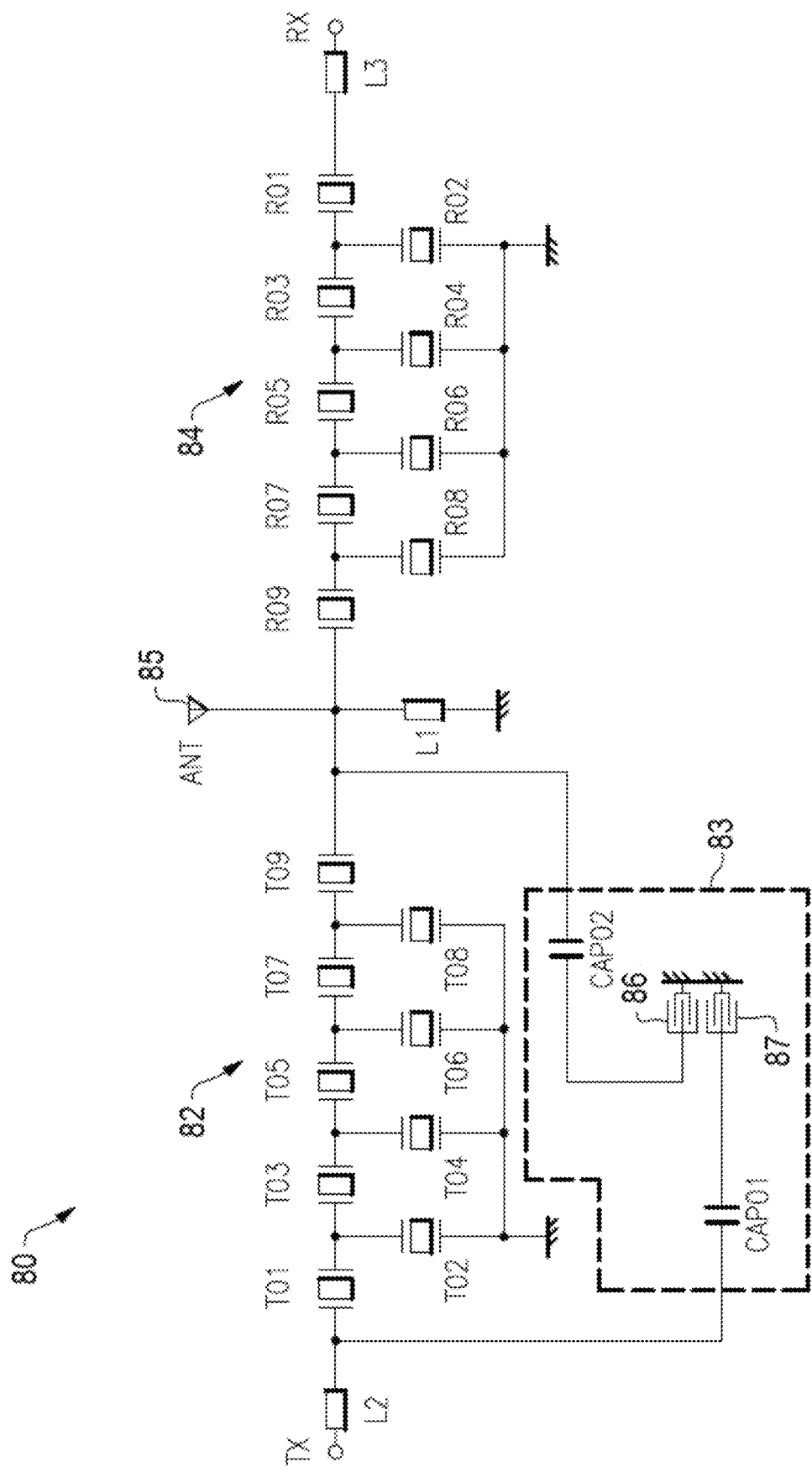
FIG. 8 is a schematic diagram of a duplexer with a loop circuit for a transmit filter.
Figure 10:
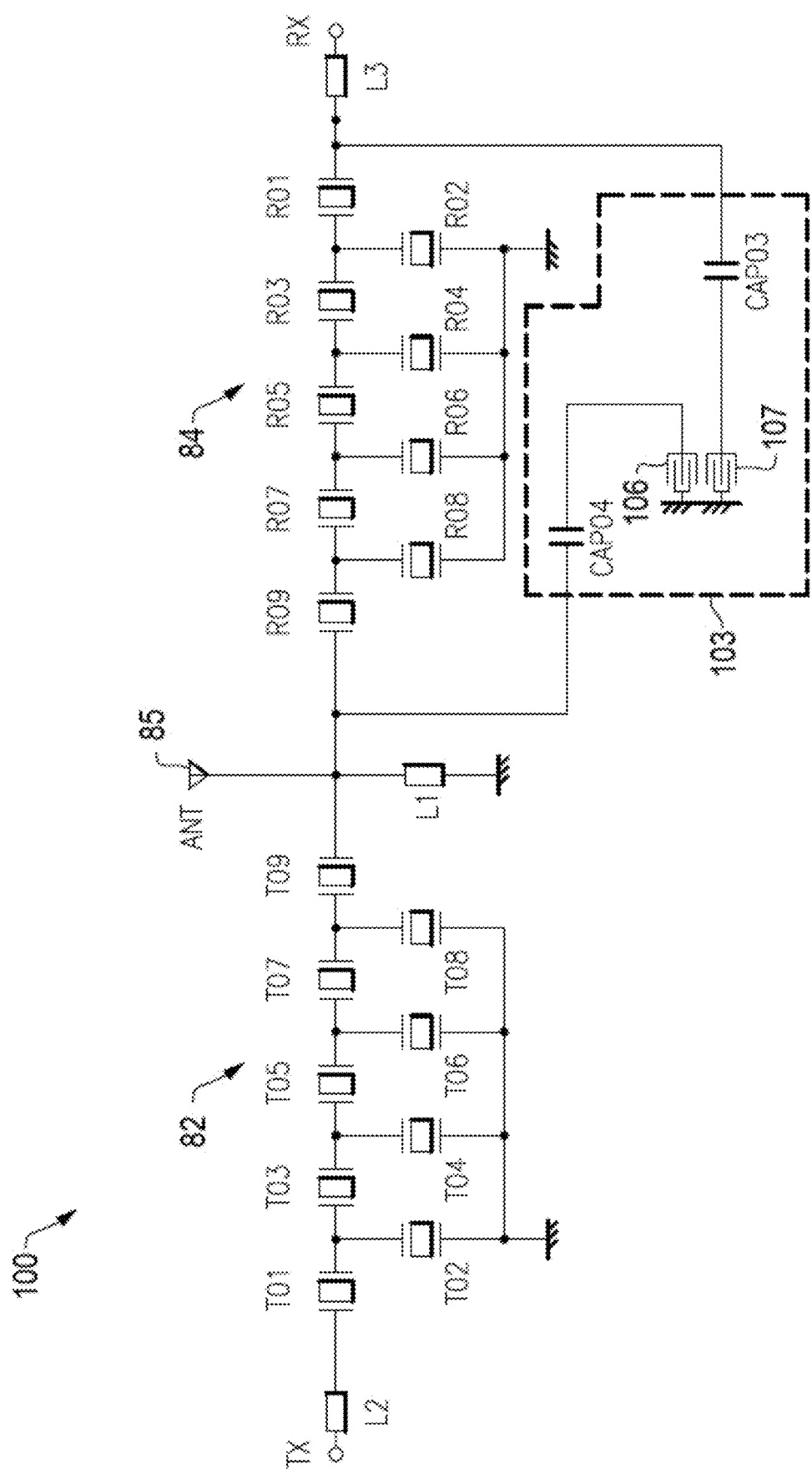
FIG. 10 is a schematic diagram of a duplexer with a loop circuit for a receive filter.
Figure 12:
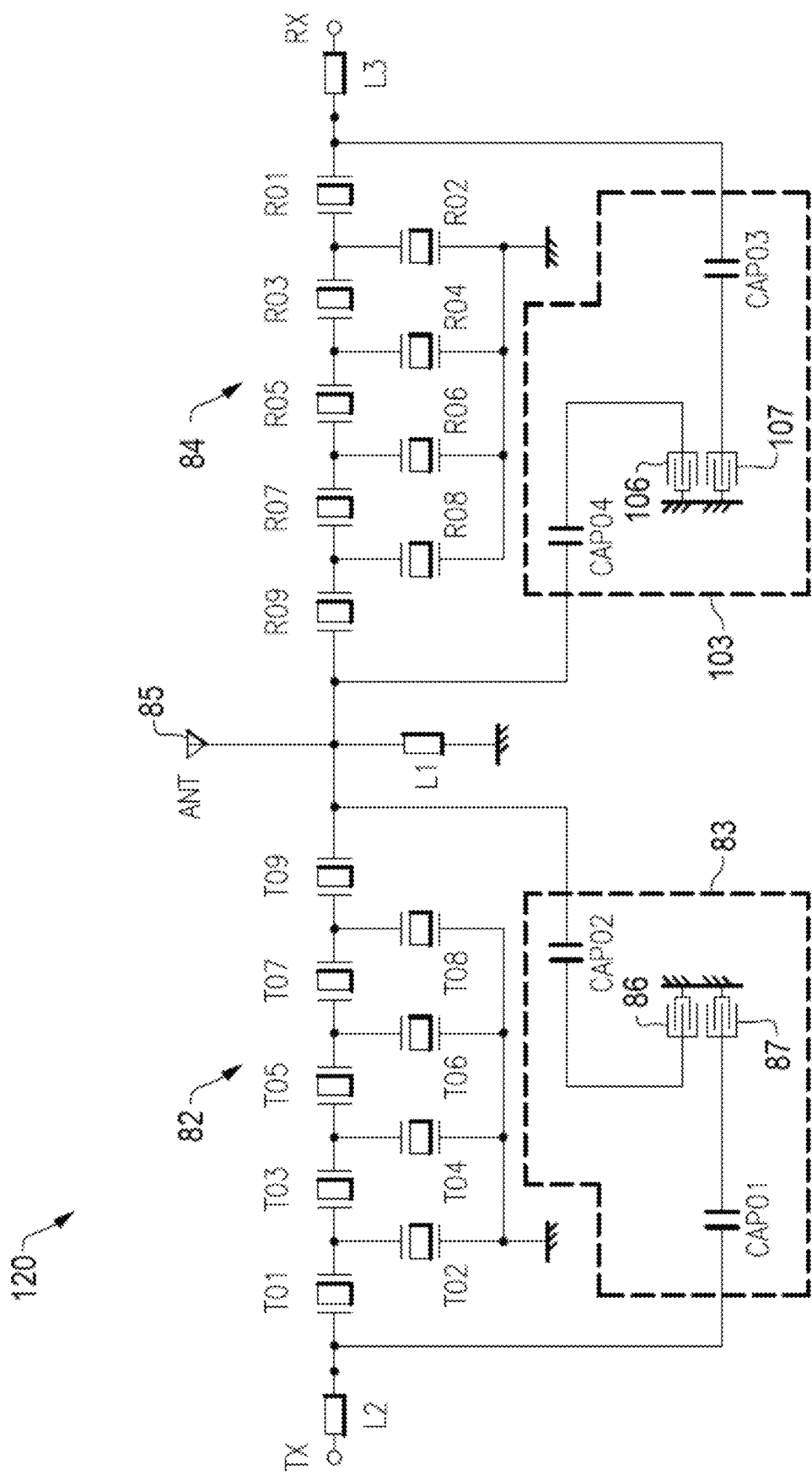
FIG. 12 is a schematic diagram of a duplexer with a first loop circuit for a transmit filter and a second loop circuit for a receive filter.

The Lamb wave resonator loop circuits discussed herein can be coupled to an acoustic wave filter. For instance, a Lamb wave resonator can be coupled to an acoustic wave filter of a duplexer or other multiplexer (e.g., a quadplexer, hexaplexer, octoplexer, etc.). FIGS. 8, 10, and 12 are schematic diagrams that illustrate example duplexers that include a Lamb wave loop circuit coupled to an acoustic wave filter. Any suitable principles and advantages discussed with reference to and/or illustrated in FIGS. 1 to 7F and FIGS. 14 to 17 discussed below can be applied to any of the example duplexers of FIGS. 8, 10, and 12.

FIG. 8 is a schematic diagram of a duplexer 80 with a loop circuit 83 for a transmit filter 82. The duplexer 80 includes a transmit filter 82, a receive filter 84, and a loop circuit 83. The transmit filter 82 and the receive filter 84 are coupled together at a node, which is an antenna node in FIG. 8. An antenna 85 is coupled to the antenna node of the duplexer 80. A shunt inductor L1 can be coupled between the antenna 85 and ground.

The transmit filter 82 can filter an RF signal received at the transmit port TX for transmission via the antenna 85. A series inductor L2 can be coupled between the transmit port TX and acoustic wave resonators of the transmit filter 82.

The transmit filter 82 is an acoustic wave filter that includes acoustic wave resonators arranged as a ladder filter. The transmit filter 82 includes series resonators T01, T03, T05, T07, T09 and shunt resonators T02, T04, T06, T08. The transmit filter 82 can include any suitable number of series resonators and any suitable number of shunt resonators. The acoustic wave resonators of the transmit filter 82 can include BAW resonators, such as FBARs and/or SMRs. In some instances, the acoustic wave resonators of the transmit filter 82 can include SAW resonators or Lamb wave resonators. In certain applications, the resonators of the transmit filter 82 can include two or more types of resonators (e.g., one or more SAW resonators and one or more BAW resonators).

A loop circuit 83 is coupled to the transmit filter 82. The loop circuit 83 can be coupled to an input resonator T01 and an output resonator T09 of the transmit filter. In some other instances, the loop circuit 83 can be coupled to a different node of the ladder circuit than illustrated. The loop circuit 83 can apply a signal having approximately the same amplitude and an opposite phase to a signal component to be canceled. The loop circuit 83 includes Lamb wave resonators 86 and 87 coupled to the transmit filter 82 by capacitors CAP02 and CAP01, respectively. Any suitable principles and advantages of the Lamb wave resonators of a loop circuit discussed herein can be implemented in the loop circuit 83. The loop circuit 83 can be implemented in accordance with any suitable principles and advantages described in U.S. Pat. No. 9,246,533 and/or U.S. Pat. No. 9,520,857. The disclosures of these patents are hereby incorporated by reference in their entireties herein.

The receive filter 84 can filter a received RF signal received by the antenna 85 and provide a filtered RF signal to a receive port RX. The receive filter 84 is an acoustic wave filter that includes acoustic wave resonators arranged as a ladder filter. The receive filter 84 includes series resonators R01, R03, R05, R07, R09 and shunt resonators R02, R04, R06, R08. The receive filter 84 can include any suitable number of series resonators and any suitable number of shunt resonators. The acoustic wave resonators of the receive filter 84 can include BAW resonators, such as FBARs and/or SMRs. In some instances, the acoustic wave resonators of the receive filter 84 can include SAW resonators or Lamb wave resonators. In certain applications, the resonators of the receive filter 84 can include two or more types of resonators (e.g., one or more SAW resonators and one or more BAW resonators). A series inductor L3 can be coupled between the acoustic wave resonators of the receive filter 84 and the receive port RX.

Figure 9:
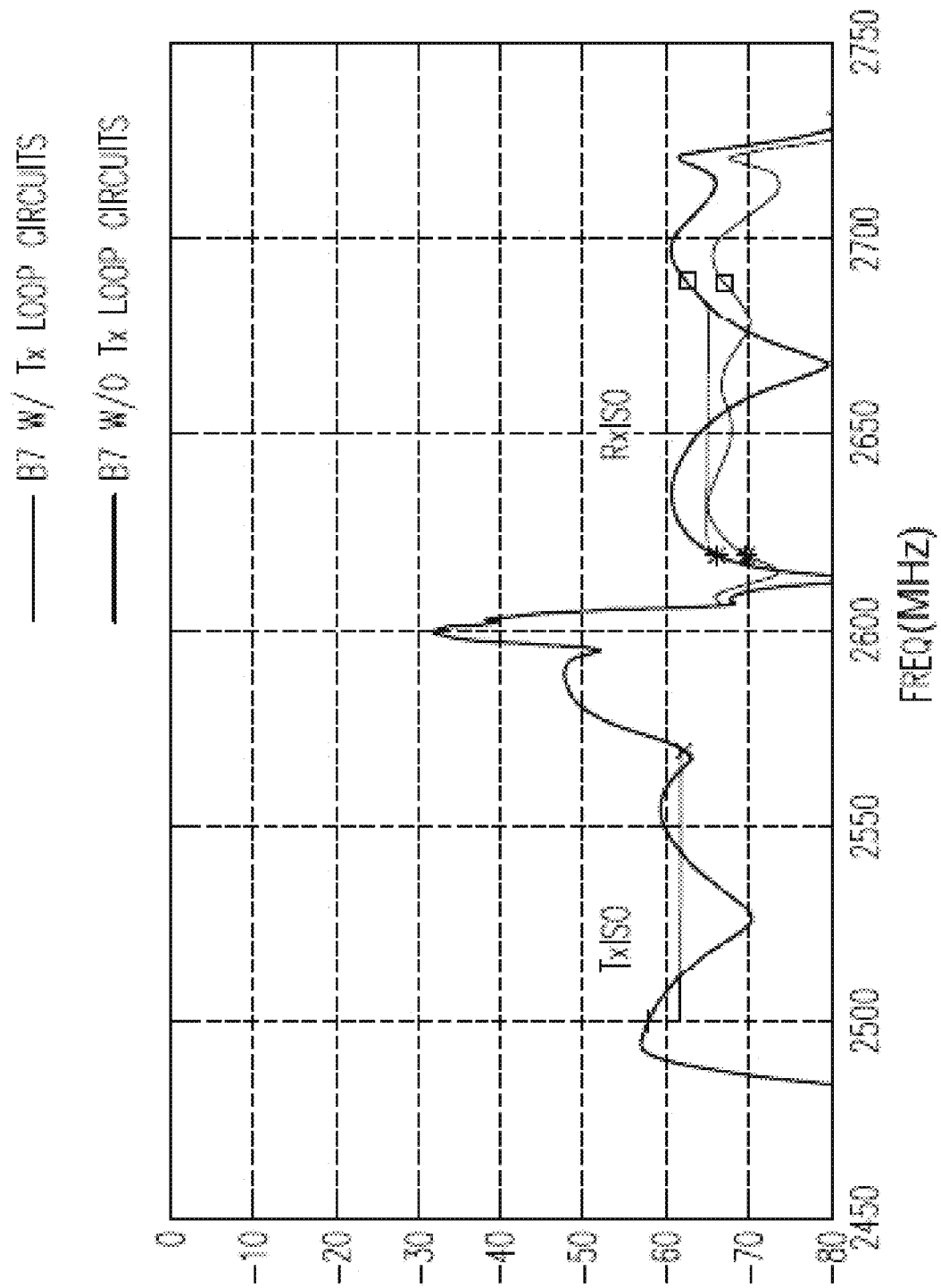
FIG. 9 is a graph comparing isolation for the duplexer of FIG. 8 to a corresponding duplexer without a loop circuit.

FIG. 9 is a graph comparing isolation characteristics for the duplexer 80 of FIG. 8 to isolation characteristics of a corresponding duplexer without a loop circuit. The acoustic wave properties of the lowest-order symmetric ($S_0$) Lamb wave mode for an AlN Lamb wave resonator were used to study the loop circuits for BAW filters. The AlN Lamb wave $S_0$ mode was assumed to have a velocity of ~9000 m/s and a $K^2$ of ~2%. A Band 7 BAW duplexer was used to generate the prophetic example. The graph in FIG. 9 indicates that the loop circuit 83 improves receive isolation. The improvement can be about 5 decibels (dB) in certain instances as indicated by FIG. 9.

FIG. 10 is a schematic diagram of a duplexer 100 with a loop circuit for a receive filter 84. The duplexer 100 is like the duplexer 80 of FIG. 8, except that the duplexer 100 includes a loop circuit 103 for the receive filter 84. The loop circuit 103 is coupled to the receive filter 84. The loop circuit 103 can be coupled to an input resonator R09 and an output resonator R01 of the receive filter 84. In some other instances, the loop circuit 103 can be coupled to a different node of the ladder circuit of the receive filter 84 than illustrated. The loop circuit 103 includes Lamb wave resonators 106 and 107 coupled to the receive filter 84 by capacitors CAP04 and CAP03, respectively. Any suitable principles and advantages of the Lamb wave resonators of a loop circuit discussed herein can be implemented in the loop circuit 103.

Figure 11A:
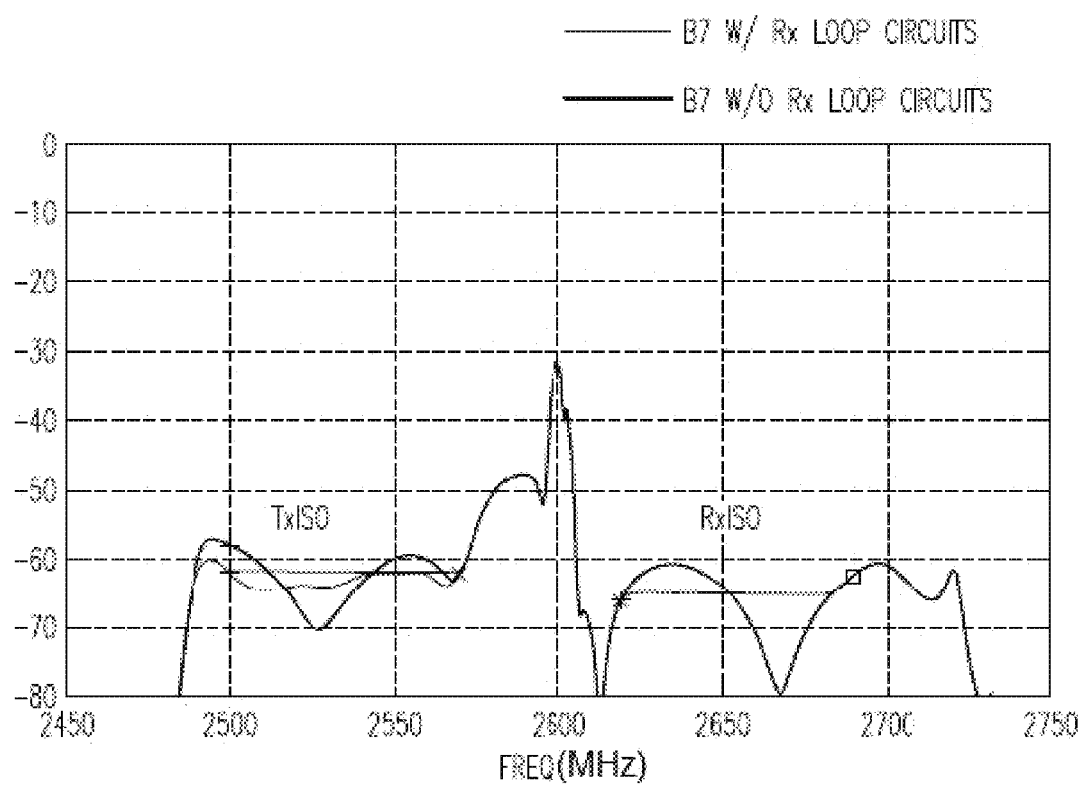
FIG. 11A is a graph comparing isolation for the duplexer of FIG. 10 to a corresponding duplexer without a loop circuit.

FIG. 11A is a graph comparing isolation characteristics for the duplexer 100 of FIG. 10 to isolation characteristics of a corresponding duplexer without a loop circuit. The same assumptions were used to generate the graphs of FIGS. 11A and 11B as for generating the graph of FIG. 9. The graph of FIG. 11A indicates that the loop circuit 103 improves transmit isolation.

Figure 11B:
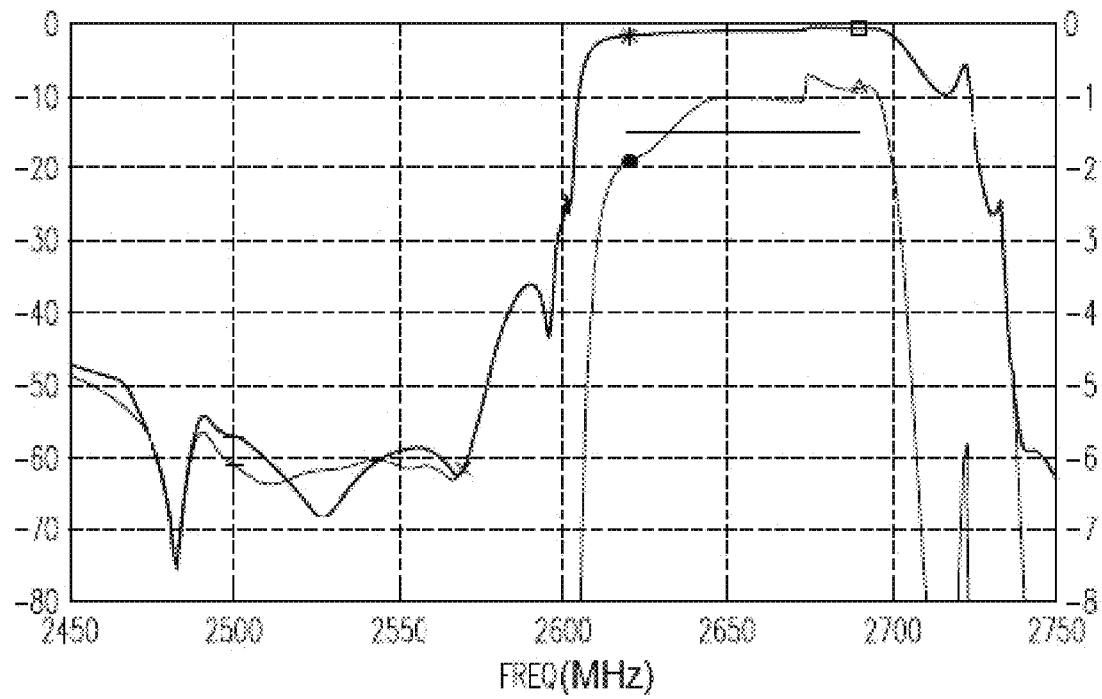
FIG. 11B is a graph comparing receive band rejection for the duplexer of FIG. 10 to a corresponding duplexer without a loop circuit.

FIG. 11B is a graph comparing receive band rejection for the duplexer 100 of FIG. 10 to receive band rejection of a corresponding duplexer without a loop circuit. This graph illustrates that the loop circuit 103 can suppress rejection at a lower frequency range for the receive band.

FIG. 12 is a schematic diagram of a duplexer 120 with a first loop circuit 83 for a transmit filter 82 and a second loop circuit 103 for a receive filter 84. FIG. 12 illustrates that separate loop circuits can be implemented for a transmit filter and a receive filter. A loop circuit can be implemented for an acoustic wave filter to bring a parameter of the acoustic wave filter within a specification. For example, a loop circuit can be implemented to bring isolation of an acoustic wave filter to be less than −60 dB to meet a specification for isolation if the acoustic wave filter would not otherwise meet the specification for isolation.

Figure 13:
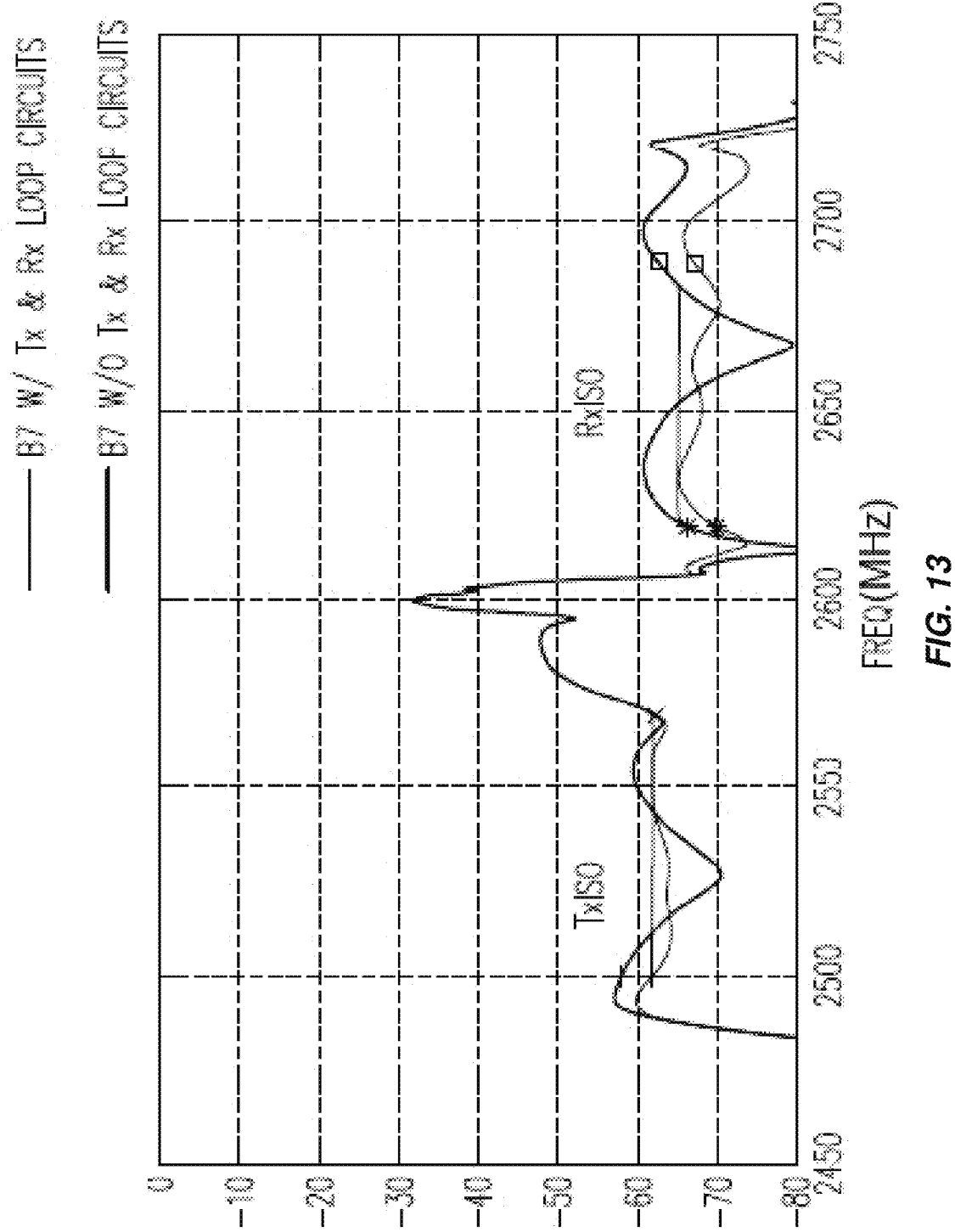
FIG. 13 is a graph comparing isolation for the duplexer of FIG. 12 to a corresponding duplexer without loop circuits.

FIG. 13 is a graph comparing isolation characteristics for the duplexer 120 of FIG. 12 to isolation characteristics of a corresponding duplexer without loop circuits. This graph indicates that the loop circuits 83 and 103 of the duplexer 120 improve both transmit and receive isolation.

Figure 14:
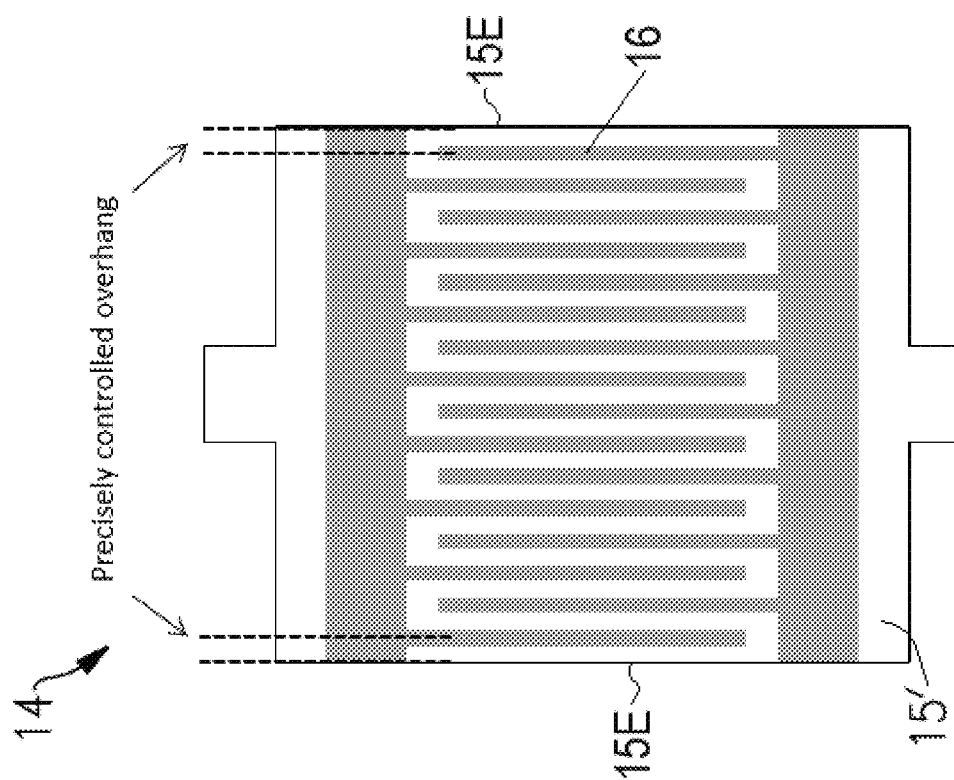
FIG. 14 is a plan view of an embodiment of a Lamb wave acoustic wave resonator.

A plan view of an embodiment of a Lamb wave resonator 14 that may be utilized in any of the embodiments disclosed herein is illustrated in FIG. 14. In the Lamb wave resonator 14 of FIG. 14 the edges 15E of the piezoelectric layer 15' are parallel to one another and to the electrode fingers of the IDT 16. The distance between the edges 15E of the piezoelectric layer 15' and the outermost electrode fingers on both sides of the IDT 16 (the "overhang") is precisely controlled, for example, to be λ/4, where λ is the wavelength of the acoustic wave excited by the IDT 16. If the overhang is not controlled to be precisely the desired value, for example, λ/4, the phase of acoustic waves reflected from the edges 15E may exhibit gross deviations from ideal, lowering the quality factor Q of the resonator 14. Additionally, if the overhang is not controlled to be precisely the desired value the excitation frequency f of the resonator may be shifted from that which would be expected based on the pitch p of the fingers of the IDT 16 ($f=\upsilon_p/2p$, $\upsilon_p$=the Lamb wave phase velocity in the resonator). If the edges 15E of the piezoelectric layer 15' are not precisely parallel to one another and to the electrode fingers of the IDT 16, acoustic waves reflected from the edges 15E may not properly constructively interfere with acoustic waves generated by the IDT 16 prior to reflection at the edges 15E or with acoustic waves that have been reflected multiple times from the edges 15E of the piezoelectric layer 15'. Small deviations in alignment of the edges 15E of the piezoelectric layer 15' with the fingers of the IDT 16 may thus reduce the Q of the Lamb wave resonator 14 and may create undesirable spurious vibration modes.

In various embodiments, the attenuation signal generated in a loop circuit of a duplexer need not be very strong to adequately cancel undesired signal components in the duplexer. In some embodiments, for example, the attenuation signal generated in a loop circuit of a duplexer may be 40 dB or more lower in power than a main pass band signal through the filters of the duplexer. Accordingly, a Lamb wave resonator in a loop circuit of a duplexer need not exhibit a low loss or high Q. Rather than precisely controlling the phase and direction of the reflections of acoustic waves from the edges 15E of the piezoelectric layer 15' (via control of the width and alignment of the overhang), it may be much simpler to suppress or scatter the reflections. Suppression or scattering of reflections of acoustic waves from the edges 15E of the piezoelectric layer 15' may be accomplished by angling, roughening, or otherwise altering the edges 15E such that waves are attenuated, scattered, or reflected in such a way as to return incoherently to the IDT 16. Lamb wave resonators which suppress or scatter reflections of acoustic waves from the edges 15E of the piezoelectric layer 15' may exhibit less variation in Q and/or frequency response than in Lamb resonators in which the width and orientation of the overhang is attempted to be tightly controlled due to manufacturing variability that may result in deviations from ideal width and orientation of the overhang.

Figure 15:
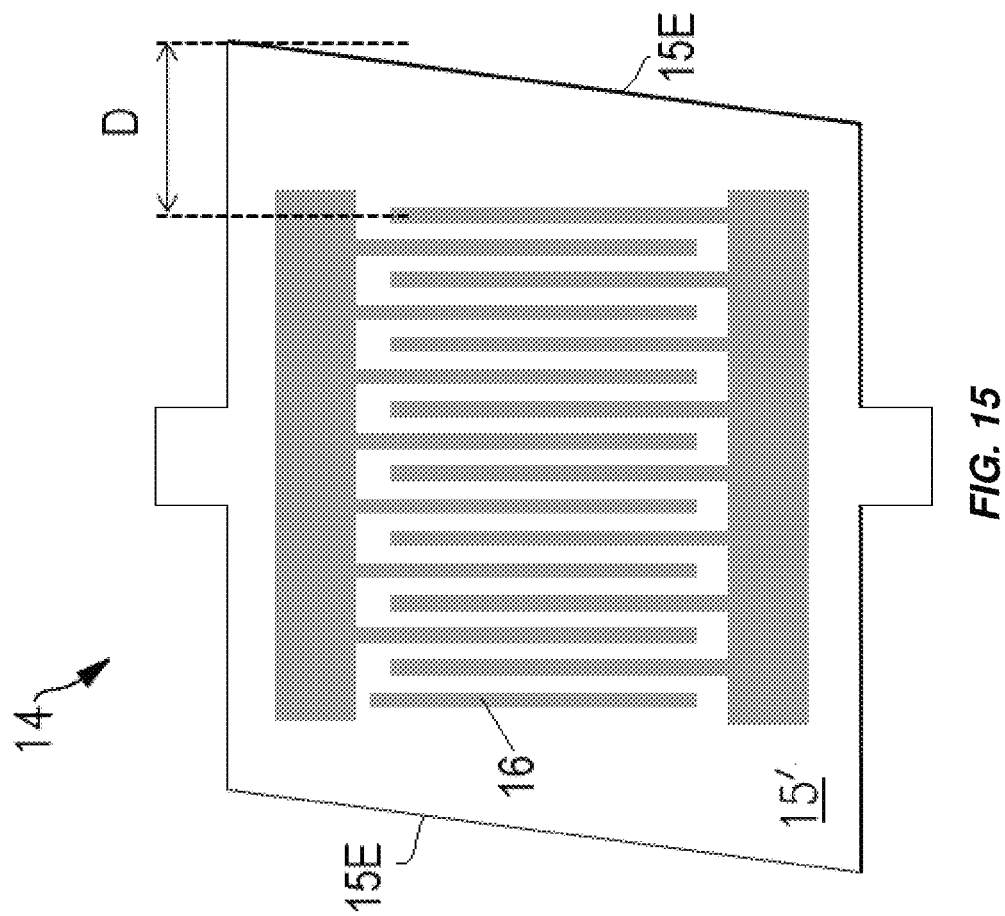
FIG. 15 is a plan view of another embodiment of a Lamb wave acoustic wave element.

One embodiment of a Lamb mode resonator 14 which is designed to suppress or scatter reflections of acoustic waves from the edges 15E of the piezoelectric layer 15' is illustrated in plan view in FIG. 15. As can be seen, the edges 15E of the piezoelectric layer 15' are tilted or angled relative to the extension direction of the electrode fingers of the IDT 16. The degree of tilt of both edges 15E is illustrated as being the same, but the degree of tilt of one edge 15E may be different than the degree of tilt of the other edge 15E in some embodiments. The width of the overhang (distance D in FIG. 15) is not of significant importance and may be the same or different for the different sides of the piezoelectric layer 15' if desired.

Figure 16:
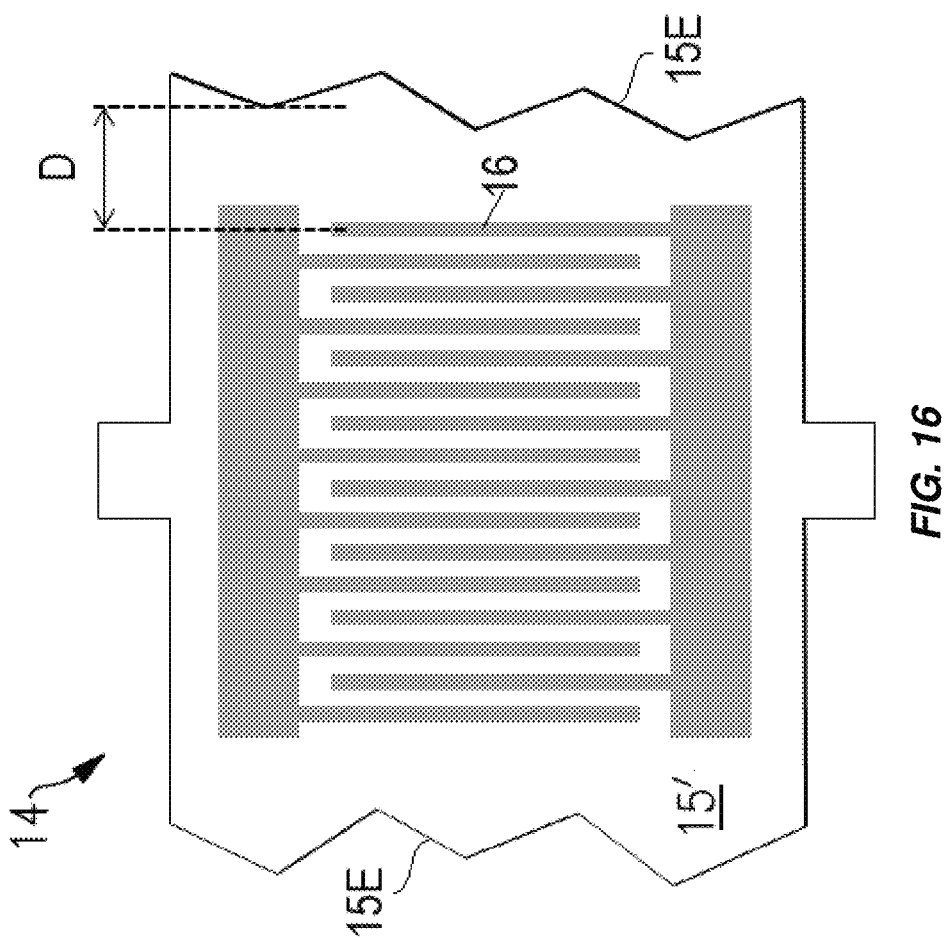
FIG. 16 is a plan view of another embodiment of a Lamb wave acoustic wave element.

Another embodiment of a Lamb mode resonator 14 which is designed to suppress or scatter reflections of acoustic waves from the edges 15E of the piezoelectric layer 15' is illustrated in plan view in FIG. 16. In this embodiment, the edges 15E of the piezoelectric layer 15' are not straight overall but include multiple straight portions tilted at different angles relative to the extension direction of the electrode fingers of the IDT 16. Adjacent ones of the multiple straight portions of the edges 15E meet at sharp angles. The edges 15E with different degrees of tilt or angle may provide incoherent reflection of acoustic waves from the edges 15E of the piezoelectric layer 15'. Like in the embodiment of FIG. 15, the width of the overhang (distance D) is not of significant importance and may be the same or different for the different sides of the piezoelectric layer 15' if desired.

Figure 17:
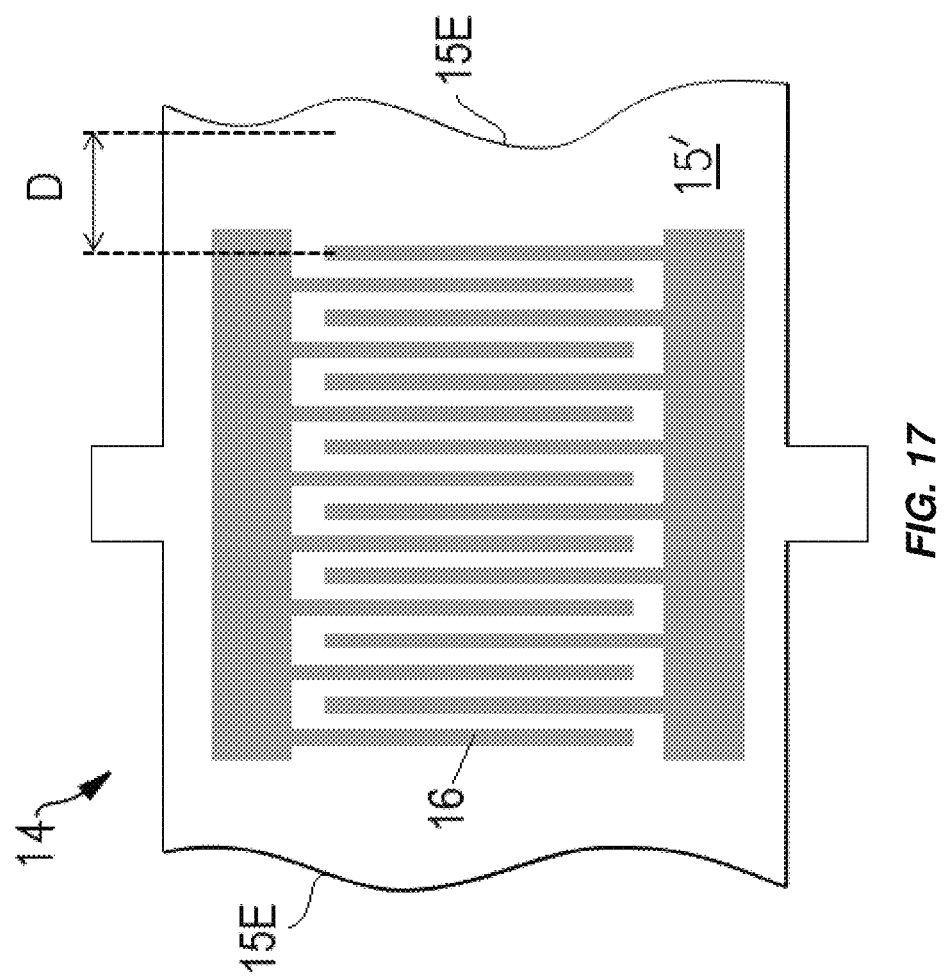
FIG. 17 is a plan view of another embodiment of a Lamb wave acoustic wave element.

A further embodiment of a Lamb mode resonator 14 which is designed to suppress or scatter reflections of acoustic waves from the edges 15E of the piezoelectric layer 15' is illustrated in plan view in FIG. 17. This embodiment is similar to that of FIG. 16, but the edges 15E include multiple curved portions rather than straight portions meeting at sharp angles. The different edges 15E may have different portions having different lengths or degree of curvature. The curved edges 15E may provide incoherent reflection of acoustic waves from the edges 15E of the piezoelectric layer 15'. Like in the embodiment of FIG. 15, the width of the overhang (distance D) is not of significant importance and may be the same or different for the different sides of the piezoelectric layer 15' if desired.

In different embodiments, any of the Lamb mode resonators 14 illustrated in FIGS. 15 to 17 may be modified such that one edge 15E is straight and optionally aligned with the electrode fingers of the IDT 16 while the other edge 15E is configured as illustrated to suppress or scatter reflections of acoustic waves from the edges 15E of the piezoelectric layer 15'. In other embodiments a Lamb mode resonator may include one edge as illustrated in any of FIGS. 14 to 17 and an opposite edge as illustrated in any other of FIGS. 14 to 17.

It is to be understood that although the Lamb wave devices illustrated in FIGS. 15 to 17 are referred to as Lamb wave resonators, in some embodiments, the suppression or scattering of reflections of acoustic waves from the edges 15E of the piezoelectric layer 15' in these devices may be significant enough to substantially or wholly prevent the devices from exhibiting resonance at their operating frequency and thus these devices may be alternatively be referred to as Lamb wave acoustic wave elements or Lamb wave acoustic wave devices.

Figure 18A:
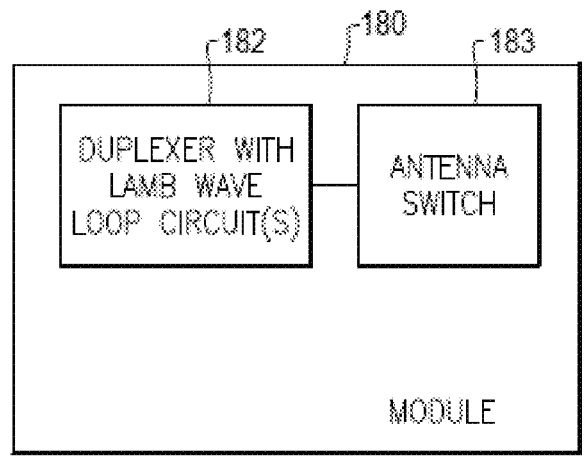
FIG. 18A is a schematic block diagram of a module that includes an antenna switch and a duplexer with a Lamb wave loop circuit.
Figure 18B:
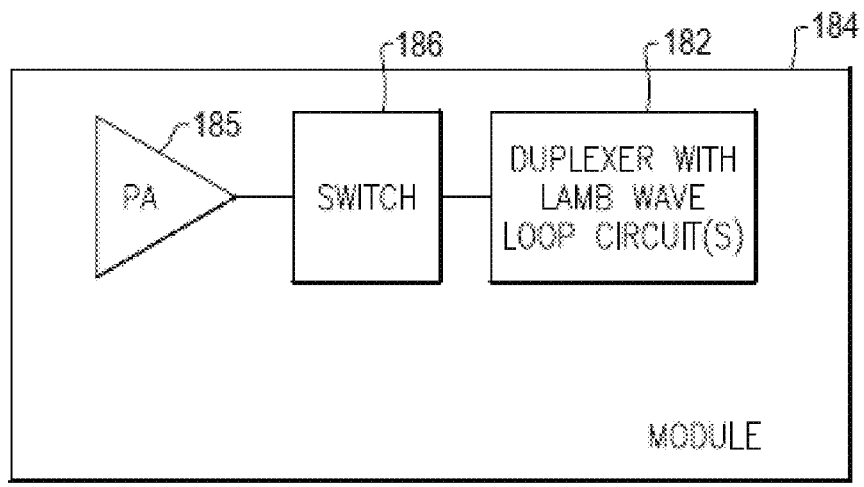
FIG. 18B is a schematic block diagram of a module that includes a power amplifier, a switch, and a duplexer with a Lamb wave loop circuit.
Figure 18C:
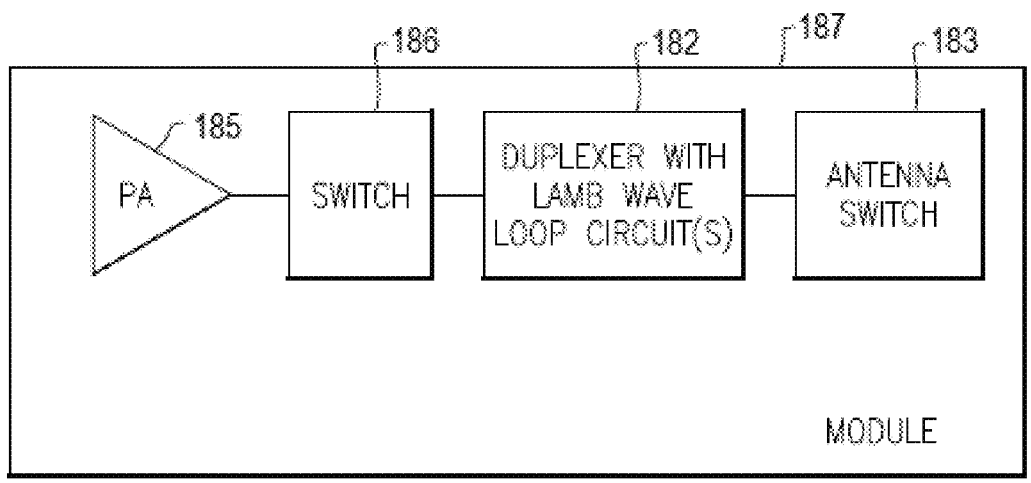
FIG. 18C is a schematic block diagram of a module that includes power amplifier, a switch, a duplexer with a Lamb wave loop circuit, and an antenna switch.

The acoustic wave devices and/or loop circuits discussed herein can be implemented in a variety of packaged modules. Some example packaged modules will now be discussed in which any suitable principles and advantages of the Lamb wave loop circuits discussed herein can be implemented. FIGS. 18A, 18B, and 18C are schematic block diagrams of illustrative packaged modules according to certain embodiments.

FIG. 18A is a schematic block diagram of a module 180 that includes a duplexer 182 with a Lamb wave loop circuit and an antenna switch 183. The module 180 can include a package that encloses the illustrated elements. The duplexer 182 with a Lamb wave loop circuit and the antenna switch 183 can be disposed on the same packaging substrate. The packaging substrate can be a laminate substrate, for example. The duplexer 182 can include a Lamb wave loop circuit in accordance with any suitable principles and advantages discussed herein. The antenna switch 183 can be a multi-throw radio frequency switch. The antenna switch 183 can selectively electrically couple a node of the duplexer 182 to an antenna port of the module 180.

FIG. 18B is a schematic block diagram of a module 184 that includes a power amplifier 185, a switch 186, and a duplexer 182 with a Lamb wave loop circuit. The power amplifier 185 can amplify a radio frequency signal. The switch 186 can selectively electrically couple an output of the power amplifier 185 to a transmit port of the duplexer 182. The duplexer 182 can include a Lamb wave loop circuit in accordance with any suitable principles and advantages discussed herein.

FIG. 18C is a schematic block diagram of a module 187 that includes power amplifier 185, a switch 186, a duplexer 182 with a Lamb wave loop circuit, and an antenna switch 183. The module 187 is similar to the module 184 of FIG. 18B, except the module 187 additionally includes the antenna switch 183.

Figure 19:
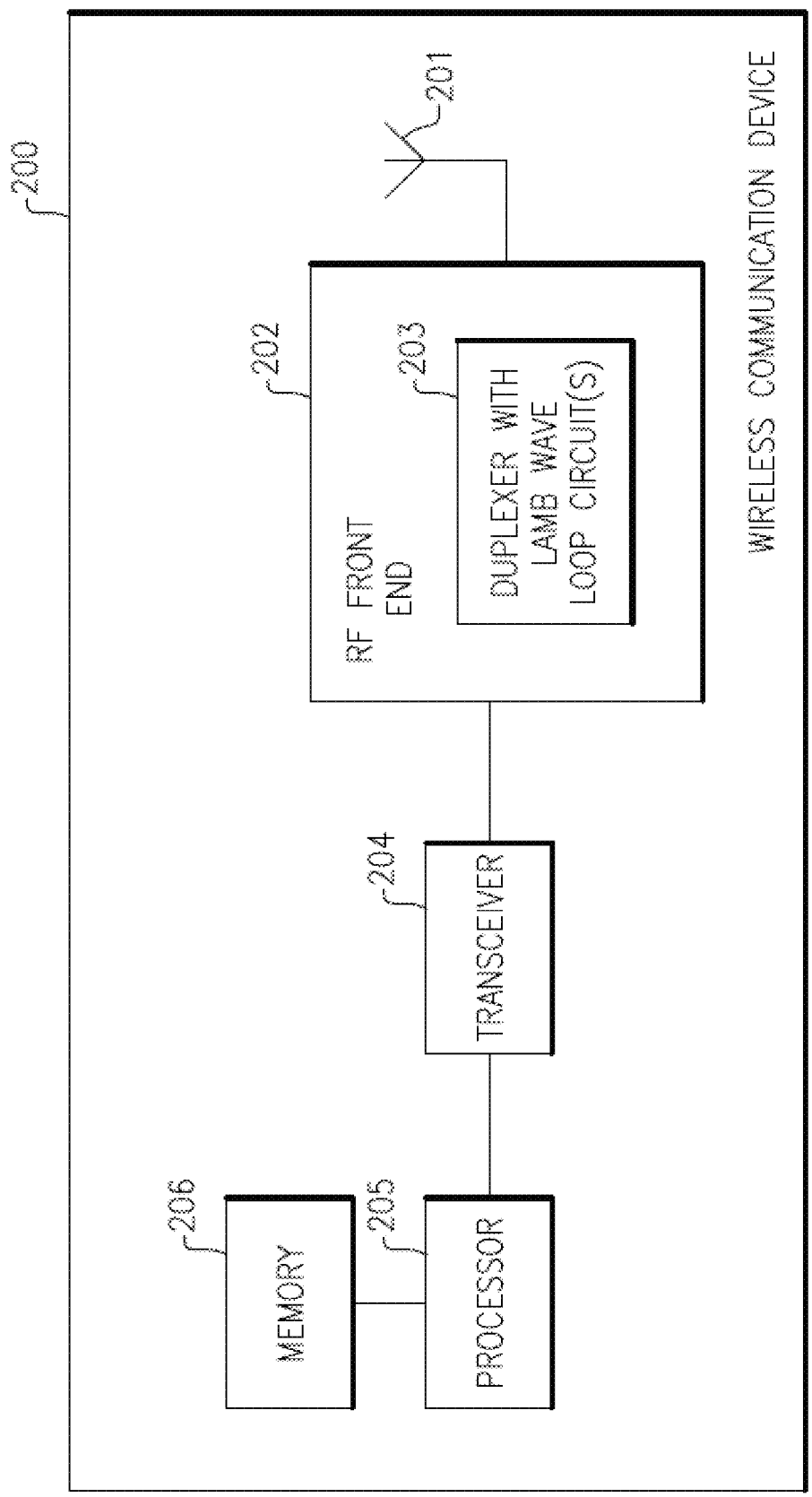
FIG. 19 is a schematic block diagram of a wireless communication device that includes a duplexer with a Lamb wave loop circuit.

FIG. 19 is a schematic block diagram of a wireless communication device 200 that includes a duplexer 203 with a Lamb wave loop circuit in accordance with one or more embodiments. The wireless communication device 200 can be any suitable wireless communication device. For instance, a wireless communication device 200 can be a mobile phone, such as a smart phone. As illustrated, the wireless communication device 200 includes an antenna 201, an RF front end 202, an RF transceiver 204, a processor 205, and a memory 206. The antenna 201 can transmit RF signals provided by the RF front end 202. The antenna 201 can provide received RF signals to the RF front end 202 for processing.

The RF front end 202 can include one or more power amplifiers, one or more low noise amplifiers, RF switches, receive filters, transmit filters, duplex filters, filters of a multiplexer, filters of a diplexers or other frequency multiplexing circuit, or any suitable combination thereof. The RF front end 202 can transmit and receive RF signals associated with any suitable communication standards. Any of the acoustic wave devices and/or Lamb wave loop circuits discussed herein can be implemented in the RF front end 202.

The RF transceiver 204 can provide RF signals to the RF front end 202 for amplification and/or other processing. The RF transceiver 204 can also process an RF signal provided by a low noise amplifier of the RF front end 202. The RF transceiver 204 is in communication with the processor 205. The processor 205 can be a baseband processor. The processor 205 can provide any suitable base band processing functions for the wireless communication device 200. The memory 206 can be accessed by the processor 205. The memory 206 can store any suitable data for the wireless communication device 200.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave device comprising:
    an acoustic wave filter configured to filter a radio frequency signal; and
    a loop circuit coupled to the acoustic wave filter, the loop circuit configured to generate an anti-phase signal to a target signal at a particular frequency, the loop circuit including a Lamb wave resonator having a piezoelectric layer and an interdigital transducer electrode disposed on the piezoelectric layer, the piezoelectric layer including free edges, an edge of the piezoelectric layer configured to one of suppress or scatter reflections of acoustic waves generated by the interdigital transducer electrode from the edge of the piezoelectric layer.

2. The acoustic wave device of claim 1 wherein the piezoelectric layer is one of an aluminum nitride layer, a lithium niobate layer, or a lithium tantalate layer.

3. The acoustic wave device of claim 1 wherein an acoustic wave mode utilized in the Lamb wave resonator is one of a lowest-order asymmetric ($A_0$) mode, a lowest-order symmetric ($S_0$) mode, a lowest-order shear horizontal ($SH_0$) mode, a first-order asymmetric ($A_1$) mode, a first-order symmetric ($S_1$) mode, or a first-order shear horizontal ($SH_1$) mode.

4. The acoustic wave device of claim 1 wherein the Lamb wave resonator is a solidly mounted resonator.

5. The acoustic wave device of claim 1 wherein the Lamb wave resonator is a free-standing resonator.

6. The acoustic wave device of claim 1 wherein the acoustic wave filter includes a bulk acoustic wave resonator.

7. The acoustic wave device of claim 6 wherein the piezoelectric layer of the Lamb wave resonator is formed of a same material as a piezoelectric material of the bulk acoustic wave resonator.

8. The acoustic wave device of claim 7 wherein the material includes aluminum nitride.

9. The acoustic wave device of claim 6 wherein the bulk acoustic wave resonator is a film bulk acoustic resonator.

10. The acoustic wave device of claim 6 wherein the bulk acoustic wave resonator is a solidly mounted resonator.

11. The acoustic wave device of claim 1 wherein the acoustic wave filter includes a second Lamb wave resonator.

12. The acoustic wave device of claim 1 wherein the Lamb wave resonator and at least one resonator of the acoustic wave filter are disposed on a same semiconductor substrate.

13. The acoustic wave device of claim 1 wherein the acoustic wave filter is a transmit filter.

14. The acoustic wave device of claim 1 wherein the acoustic wave filter is a receive filter.

15. The acoustic wave device of claim 1 further comprising a second acoustic wave filter, the acoustic wave filter and the second acoustic wave filter being included in a duplexer.

16. A radio frequency module comprising:
    a duplexer including an acoustic wave device, the acoustic wave device including an acoustic wave filter configured to filter a radio frequency signal and a loop circuit coupled to the acoustic wave filter, the loop circuit configured to generate an anti-phase signal to a target signal at a particular frequency, and the loop circuit including a Lamb wave resonator having a piezoelectric layer and an interdigital transducer electrode disposed on the piezoelectric layer, the piezoelectric layer including free edges, an edge of the piezoelectric layer configured to one of suppress or scatter reflections of acoustic waves generated by the interdigital transducer electrode from the edge of the piezoelectric layer; and
    a radio frequency switch arranged to pass a radio frequency signal associated with a port of the duplexer.

17. The radio frequency module of claim 16 further comprising a power amplifier, the radio frequency switch coupled in a signal path between the power amplifier and the duplexer.

18. The radio frequency module of claim 16 wherein the radio frequency switch is one of an antenna switch or a band select switch.

19. A wireless communication device comprising:
    a radio frequency front end including an acoustic wave device, the acoustic wave device including an acoustic wave filter configured to filter a radio frequency signal and a loop circuit coupled to the acoustic wave filter, the loop circuit configured to generate an anti-phase signal to a target signal at a particular frequency, and the loop circuit including a Lamb wave resonator having a piezoelectric layer and an interdigital transducer electrode disposed on the piezoelectric layer, the piezoelectric layer including free edges, an edge of the piezoelectric layer configured to one of suppress or scatter reflections of acoustic waves generated by the interdigital transducer electrode from the edge of the piezoelectric layer; and an antenna in communication with the radio frequency front end.

20. A filter comprising:

an input terminal;

an output terminal;

a main bulk acoustic wave filter circuit connected between the input terminal and the output terminal, the main bulk acoustic wave filter circuit having a first phase characteristic, a first passband, and a first stopband; and a phase shift circuit connected in parallel with the main bulk acoustic wave filter circuit between the input terminal and the output terminal, the phase shift circuit including a first capacitor element, a second capacitor element, and a Lamb mode coupled resonator connected in series between the first capacitor element and the second capacitor element, the Lamb mode coupled resonator including at least two interdigitated transducer electrodes disposed apart from each other on a piezoelectric layer in a single acoustic wave path along which acoustic waves propagate through the Lamb mode coupled resonator, the piezoelectric layer including free edges, an edge of the piezoelectric layer configured to one of suppress or scatter reflections of acoustic waves generated by the Lamb mode coupled resonator from the edge of the piezoelectric layer, the phase shift circuit having a second phase characteristic that is opposite to the first phase characteristic in an attenuation band that corresponds to at least a portion of the first stopband.

* * * * *